United States Patent
Balakrishnan et al.

(10) Patent No.: US 9,570,575 B1
(45) Date of Patent: Feb. 14, 2017

(54) CAPACITOR IN STRAIN RELAXED BUFFER

(71) Applicant: INTERNATIONAL BUSINESS MACHINES CORPORATION, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/974,123

(22) Filed: Dec. 18, 2015

(51) Int. Cl.
| | |
|---|---|
| H01L 29/66 | (2006.01) |
| H01L 21/02 | (2006.01) |
| H01L 29/04 | (2006.01) |
| H01L 21/31 | (2006.01) |
| H01L 21/306 | (2006.01) |
| H01L 21/3205 | (2006.01) |
| H01L 29/165 | (2006.01) |
| H01L 29/16 | (2006.01) |
| H01L 29/94 | (2006.01) |

(52) U.S. Cl.
CPC ... *H01L 29/66181* (2013.01); *H01L 21/02532* (2013.01); *H01L 21/02598* (2013.01); *H01L 21/02636* (2013.01); *H01L 21/30604* (2013.01); *H01L 21/31* (2013.01); *H01L 21/32051* (2013.01); *H01L 29/04* (2013.01); *H01L 29/16* (2013.01); *H01L 29/165* (2013.01); *H01L 29/945* (2013.01)

(58) Field of Classification Search
CPC .............. H01L 21/02532; H01L 21/02598; H01L 21/30604; H01L 21/31; H01L 21/32051; H01L 29/04; H01L 29/16; H01L 29/165; H01L 29/945
See application file for complete search history.

(56) References Cited

U.S. PATENT DOCUMENTS 5,155,657 A * 10/1992 Oehrlein ............. H01L 21/3065
257/298
6,346,455 B1 2/2002 Thakur et al.

* cited by examiner

*Primary Examiner* — Daniel Shook
(74) *Attorney, Agent, or Firm* — Cantor Colburn LLP; Louis Percello

(57) ABSTRACT

Aspects include a semiconductor structure and fabrication method. A semiconductor structure may include alternating first and second crystalline layers and a capacitor. The capacitor may include a first terminal, a second terminal, and a dielectric. The first terminal may include a first central portion and first lobes extending laterally from the first central portion. The second terminal may include a second central portion and second lobes extending laterally from the second central portion. A portion of the second lobes may be fitted between consecutive first lobes. The fabrication method may include forming alternating first and second crystalline layers, forming a first trench, selectively etching the first crystalline layers within the first trench, depositing a dielectric in the first trench, filling the first trench with a metal, forming a second trench, etching the first and second crystalline layers within the second trench, and filling the second trench with a metal.

17 Claims, 25 Drawing Sheets

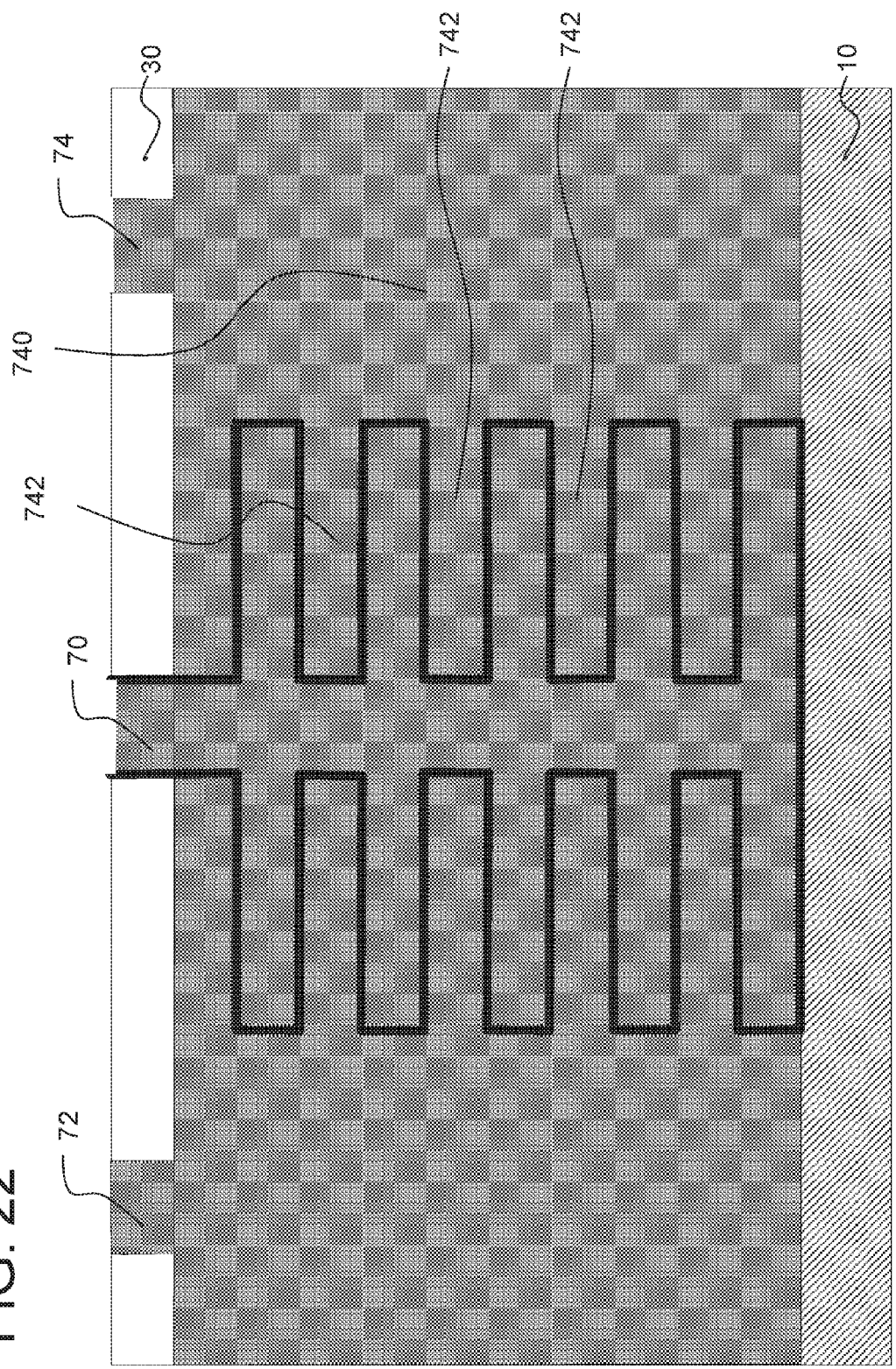

US 9,570,575 B1

CAPACITOR IN STRAIN RELAXED BUFFER

BACKGROUND

The present invention relates generally to capacitors and, more specifically, to high-density, on-chip capacitors.

Conventional planar MOS capacitors consume a significant chip area. Additionally, deep trench capacitor formation has a great degree of process complexity at scaled technology nodes, especially when using a strain relaxed buffer.

SUMMARY

Embodiments may include a semiconductor structure and a semiconductor fabrication method.

An embodiment of a semiconductor structure may include a strain relaxed buffer comprising a plurality of first crystalline layers and a plurality of second crystalline layers, wherein the first crystalline layers and second crystalline layers are arranged alternately; and a capacitor provided inside the strain relaxed buffer. The capacitor may include a first capacitor terminal; a second capacitor terminal; and a dielectric provided between the first capacitor terminal and the second capacitor terminal. The first capacitor terminal may include a first capacitor terminal central portion extending through the first crystalline layers and the second crystalline layers; and a plurality of first capacitor terminal lobes extending laterally from the first capacitor terminal central portion. The second capacitor terminal may include a second capacitor terminal central portion extending through the first crystalline layers and the second crystalline layers; and a plurality of second capacitor terminal lobes extending laterally from the second capacitor terminal central portion. The first capacitor terminal and the second capacitor terminal may be arranged such that a portion of the plurality of second capacitor terminal lobes are fitted between consecutive first capacitor terminal lobes. The first capacitor terminal and the second capacitor terminal may include a metal.

An embodiment of a semiconductor fabrication method may include epitaxially growing a stress relaxed buffer on a substrate, the stress relaxed buffer comprising a plurality of first crystalline layers and a plurality of second crystalline layers arranged alternately; epitaxially growing a strained crystalline layer on the stress relaxed buffer; forming a protective layer over the strained crystalline layer; forming a first trench through the protective layer, the strained crystalline layer, and the strain relaxed buffer; selectively etching the plurality of first crystalline layers from with the first trench to create a plurality of first spaces extending laterally from the first trench; depositing a dielectric along surfaces of the first trench and the plurality of first spaces using atomic layer deposition; filling the first trench and the plurality of first spaces with a metal using atomic layer deposition; forming a second trench through the protective layer, the strained crystalline layer, and the strain relaxed buffer; etching the plurality of first crystalline layers and the plurality of second crystalline layers from within the second trench to expose the dielectric and form a cavity and a plurality of second spaces extending laterally from the first trench; and filling the cavity and the plurality of second spaces with the metal using atomic layer deposition.

An embodiment of a semiconductor structure may include a strain relaxed buffer comprising a plurality of first crystalline layers and a plurality of second crystalline layers, wherein the first crystalline layers and second crystalline layers are arranged alternately; and a capacitor provided inside the strain relaxed buffer. The capacitor may include a plurality of first capacitor terminals; a plurality of second capacitor terminals; and a dielectric provided between the plurality of first capacitor terminals and the plurality of second capacitor terminals. Each of the plurality of first capacitor terminals may include a first capacitor terminal central portion extending through the first crystalline layers and the second crystalline layers; and a plurality of first capacitor terminal lobes extending laterally from the first capacitor terminal central portion. Each of the plurality of second capacitor terminal may include a second capacitor terminal central portion extending through the first crystalline layers and the second crystalline layers; and a plurality of second capacitor terminal lobes extending laterally from the second capacitor terminal central portion. Each of the plurality of first capacitor terminals may be mutually electrically connected. Each of the plurality of second capacitor terminals may be mutually electrically connected. Each first capacitor terminal central portion of the plurality of first capacitor terminals may be mutually parallel and extend in a longitudinal direction. Each second terminal capacitor central portion of the plurality of second capacitor terminals may be mutually parallel. A portion of the plurality of second capacitor terminals may provided between consecutive first capacitor terminals and arranged such that a portion of the plurality of second capacitor terminal lobes are fitted between consecutive first capacitor terminal lobes.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 22 depicts the structure of FIG. 21 with deposition of an additional metal in accordance with some embodiments of the disclosure.

DETAILED DESCRIPTION

In view of a desire to form high density capacitors along with complementary metal-oxide-semiconductor (CMOS) without sacrificing layout density when using a strain relaxed buffer, it would be helpful to form the capacitors in the strain relaxed buffer.

Figure 1:
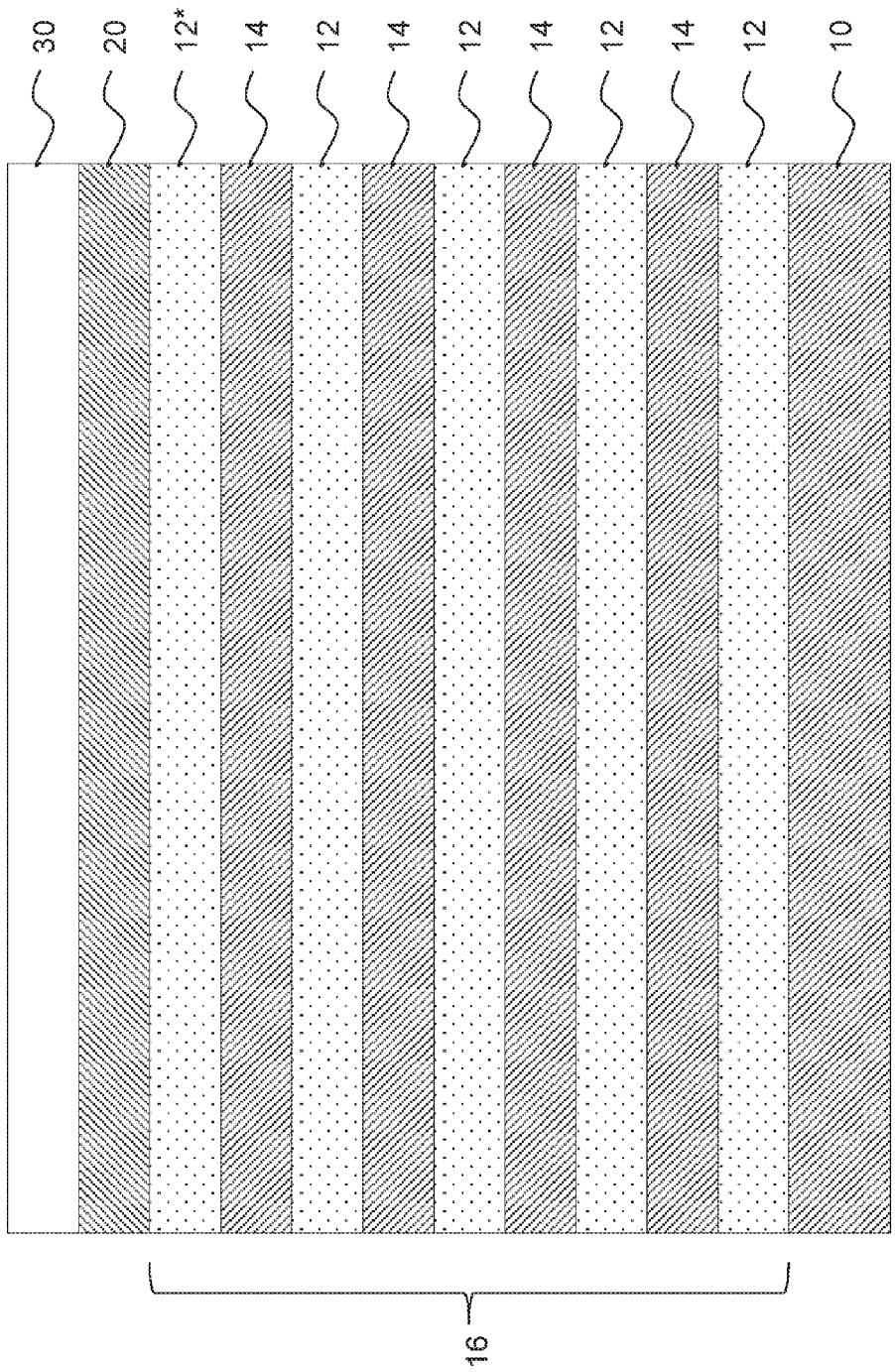
FIG. 1 depicts a cross-sectional view of a semiconductor structure in accordance with some embodiments of the disclosure.
Figure 2:
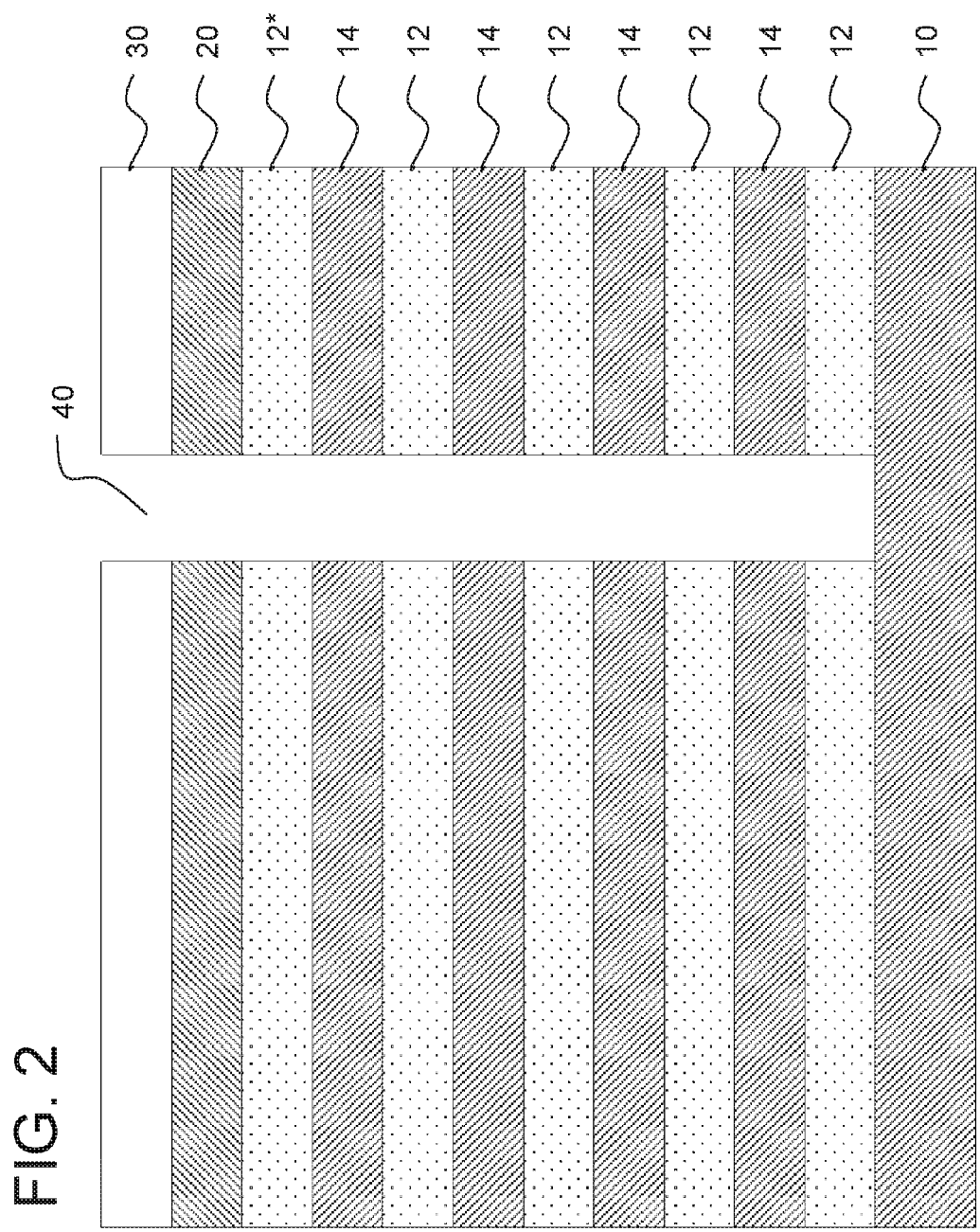
FIG. 2 depicts the structure of FIG. 1 with a trench in accordance with some embodiments of the disclosure.

FIG. 1 shows a semiconductor substrate structure in accordance with some embodiments. The semiconductor substrate structure may include a substrate 10, first crystalline layers 12, second crystalline layers 14, a strained silicon layer 20, and an interlayer dielectric 30.

The substrate 10 may be approximately 0.3-3 µm thick. Substrate 10 may be formed of silicon.

First crystalline layers 12 and second crystalline layers 14 may be epitaxially grown on substrate in alternating layers. First crystalline layers 12 may be formed of SiGe, and second crystalline layers 14 may be formed of silicon. However, it will be understood that first crystalline layers 12 and second crystalline layers 14 are not limited to these materials and may be formed of other suitable materials, such as InGaAs and InP. When SiGe is used as the material for first crystalline layers 12, the concentration of the Ge may be approximately 25%. However, it will be understood that the present disclosure is not limited to this concentration. For example, in some embodiments, the concentration of Ge may be 20-30% or 20-40%.

First crystalline layers 12 and second crystalline layers 14 may be approximately 30 nm thick. However, it will be understood thickness of first crystalline layers 12 and second crystalline layers 14 is not limited to approximately 30 nm, and thicknesses in the range of 10 nm to 100 nm may be appropriate. Additionally, it will be understood that the top-most first crystalline layer (indicated as 12* in the Figures) may be thicker than the other first crystalline layers 12 and second crystalline layers 14 in order to accommodate CMOS fabrication.

Taken together, first crystalline layers 12 and second crystalline layers 14 form a strain relaxed buffer (SRB) 16. A total thickness of the SRB 16 may be 1-2 µm, although thicknesses of up to 5 µm or more may be used depending on the specific application.

FIG. 1 shows five first crystalline layers 12 and four second crystalline layers 14. However, it will be understood that the disclosure is not limited to this specific number of layers. The number of layers of first crystalline layers 12 and second crystalline layers 14 may be varied depending on the specific application.

Strained Si layer 20 is epitaxially formed over the SRB 16, and interlayer dielectric 30 may be formed on the strained Si layer 20 as a protective layer.

Figure 3:
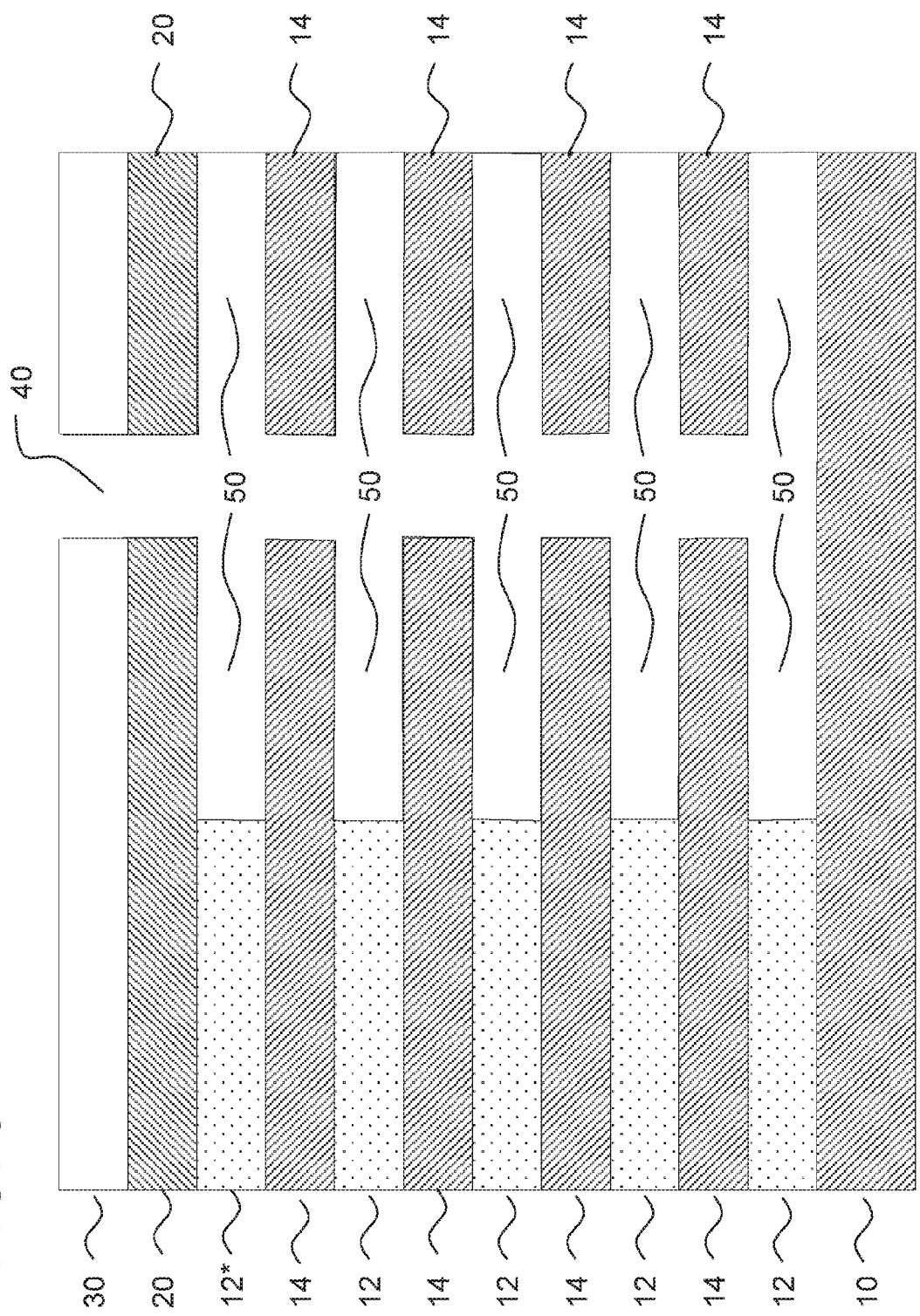
FIG. 3 depicts the structure of FIG. 2 with selective etching of layers in accordance with some embodiments of the disclosure.

FIGS. 2-8 show a method of forming a trench metal-insulator-metal capacitor in accordance with some embodiments of the disclosure. For example, in FIG. 2, a first trench 40 may be etched or cut through interlayer dielectric 30, strained silicon layer 20, first crystalline layers 12 and second crystalline layers 14. Next, as seen in FIG. 3, portions of first crystalline layers 12 are selectively etched from with first trench 40 to form first spaces 50 laterally extending from first trench 40. First spaces 50 may be mutually parallel. The etchant used to form first spaces 50 should be chosen so that it etches only first crystalline layers 12 and not second crystalline layers 14. For example, if first crystalline layers 12 are formed of SiGe and second crystalline layers 14 are formed of silicon, the etchant may be HCl gas. However, it will be understood that the disclosure is not limited to using HCl gas as an etchant and other suitable etchants may be used as long as they etch first crystalline layer 12 and not second crystalline layer 14.

Figure 4:
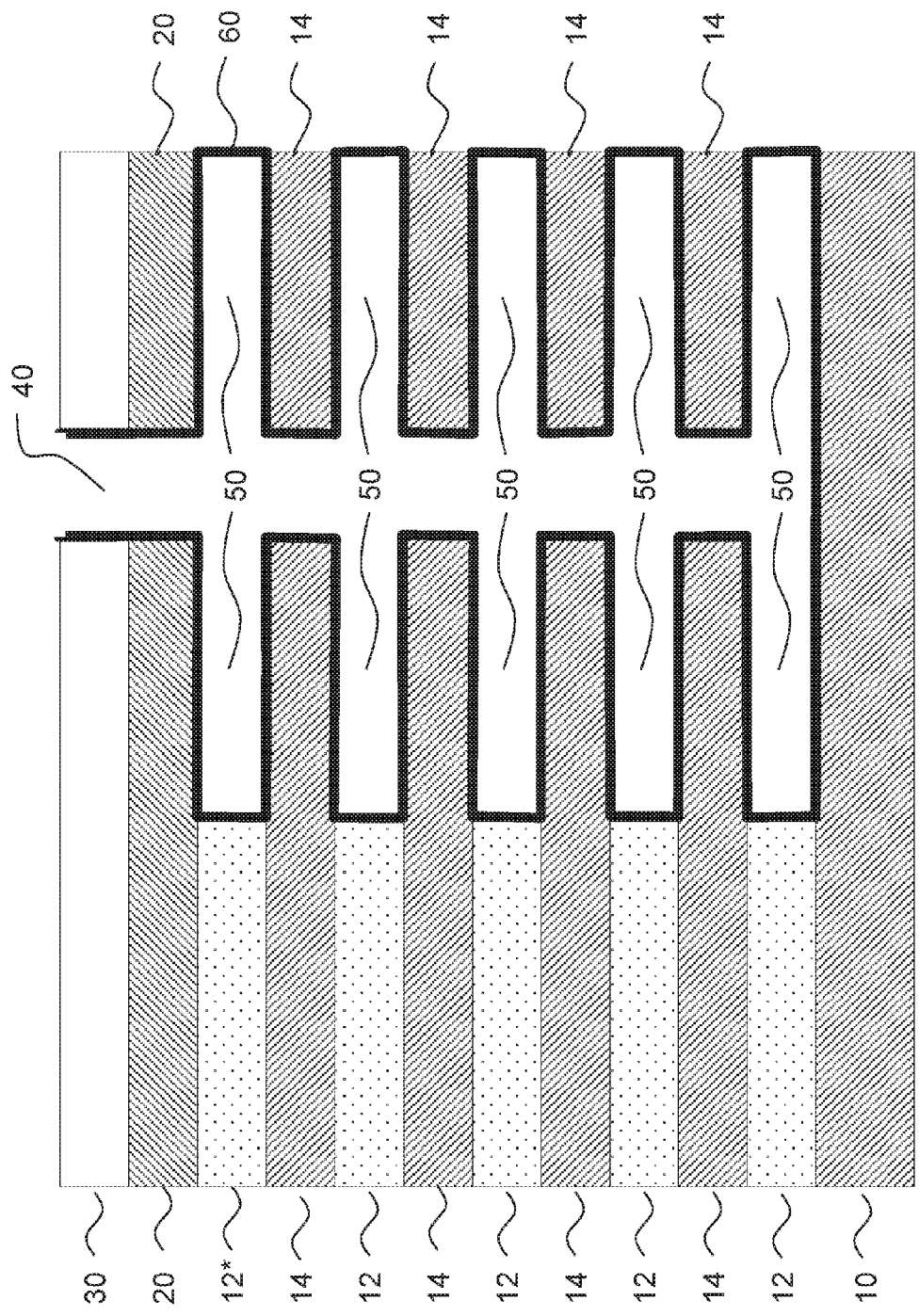
FIG. 4 depicts the structure of FIG. 3 with deposition of a dielectric in accordance with some embodiments of the disclosure.

As seen in FIG. 4, a thin dielectric 60 may be deposited in first trench 40 and in first spaces 50. Thin dielectric 60 may be deposited using atomic layer deposition (ALD). Thin dielectric 60 may be formed with a thickness of approximately 2-10 nm, and may be formed of a material such as $SiO_2$. However, it will be understood that the disclosure is not limited to $SiO_2$, and other suitable materials may be used, such as high-k materials. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof.

Figure 5:
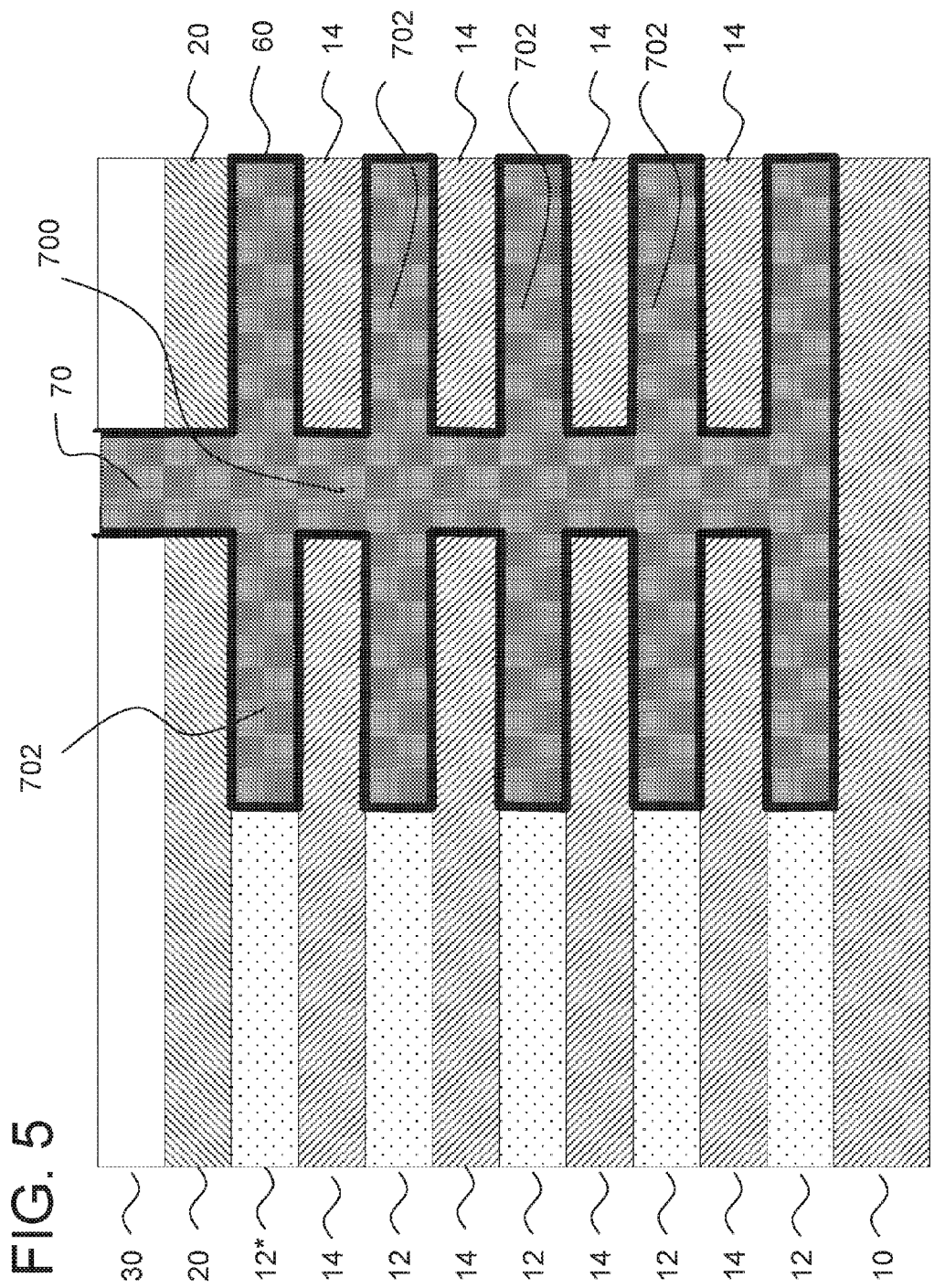
FIG. 5 depicts the structure of FIG. 4 with deposition of a metal in accordance with some embodiments of the disclosure.

As seen in FIG. 5, metal may be filled into the first trench 40 and first spaces 50 to form first capacitor terminal 70. First capacitor terminal 70 includes a first capacitor terminal central portion 700 formed where the first trench 40 was formed and a plurality of first capacitor terminal lobes 702 formed in first spaces 50 where the first crystalline layers 12 were selectively etched away. In other words, first capacitor terminal central portion extends through first crystalline layers 12 and second crystalline layers 14, and first capacitor terminal lobes 702 may be plate-shaped and extend laterally from first capacitor terminal central portion 700 of the first capacitor terminal 70. It will be understood that first capacitor terminal lobes 702 are approximately mutually parallel.

First capacitor terminal 70 may be formed by ALD, and it will be understood that deposition of the metal will be conformal along the sidewalls of first trench 40 and first spaces 50. In some embodiments, first capacitor terminal 70 may be formed of a metal such as tungsten or ruthenium. However, it will be understood that a wide variety of metals may be used to form first capacitor terminal 70.

Figure 6:
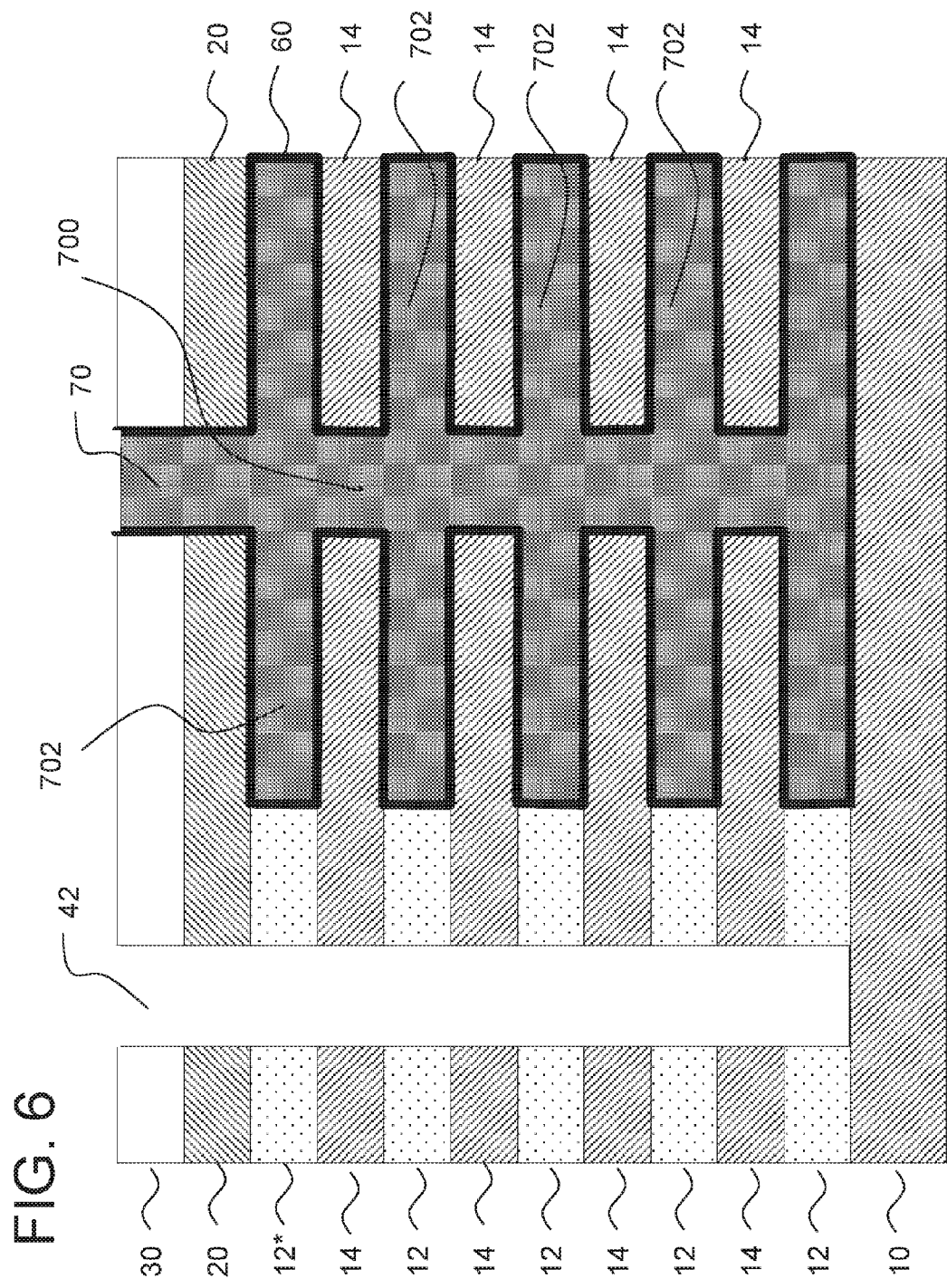
FIG. 6 depicts the structure of FIG. 5 with a second trench in accordance with some embodiments of the disclosure.

As seen in FIG. 6, a second trench 42 may be formed. Second trench may etched or cut through interlayer dielectric 30, strained Si layer 20, first crystalline layers 12 and second crystalline layers 14, and may be positioned such that there is a gap between sidewalls of second trench 42 and outermost edges of first capacitor terminal lobes 702.

Figure 7:
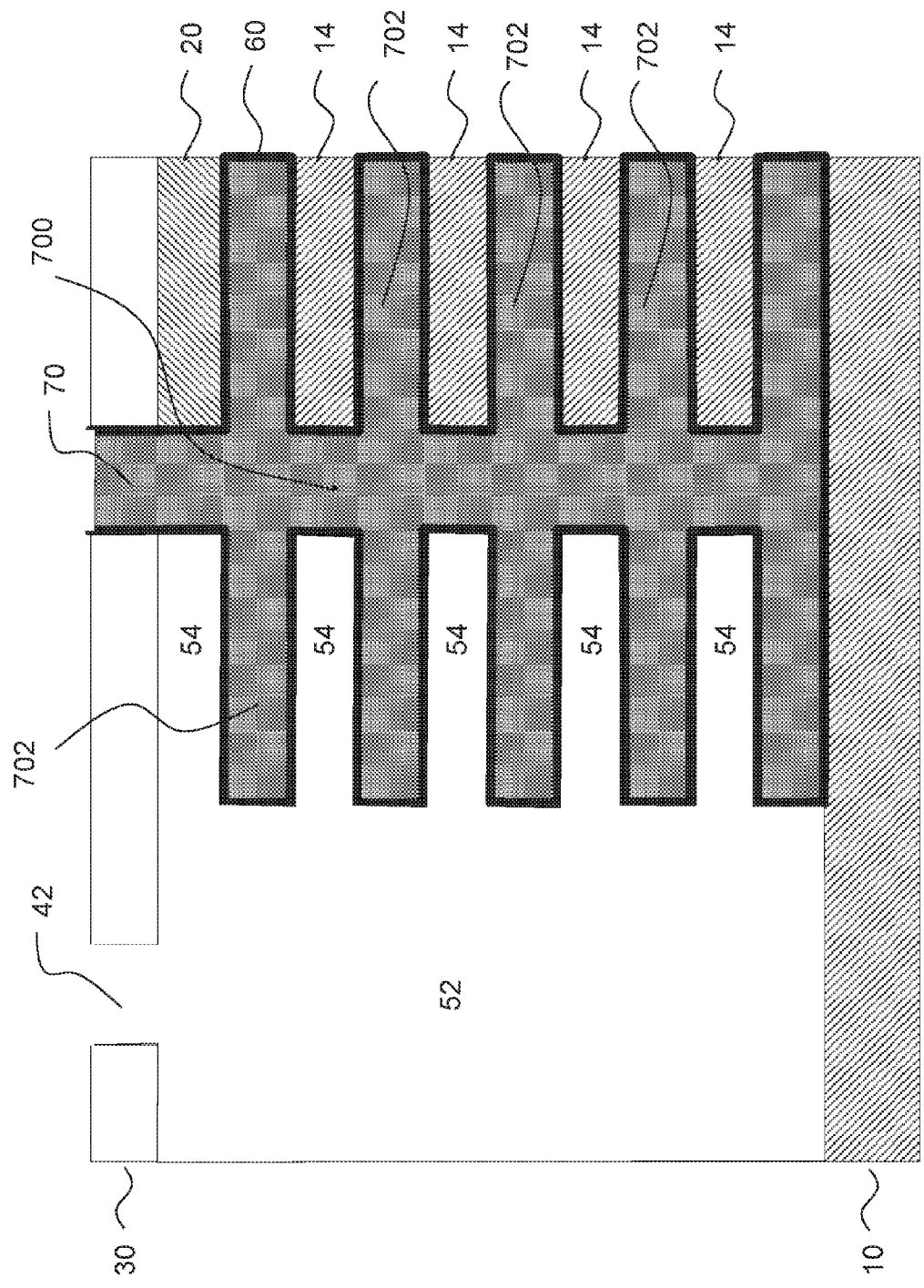
FIG. 7 depicts the structure of FIG. 6 with further etching of layers in accordance with some embodiments of the disclosure.

As seen in FIG. 7, further etching is carried out to remove first crystalline layers 12 and second crystalline layers 14, leaving cavity 52. As further seen in FIG. 7, the etching also leaves second spaces 54 between first capacitor terminal lobes 702 where the second crystalline layers 14 are removed. It will be understood that the removal of both first crystalline layers 12 and second crystalline layers 14 may require more than one etching using different etchants. For example, if the plurality of first crystalline layers 12 comprises SiGe and the plurality of second crystalline layers comprises Si, the plurality of first crystalline layers 12 may be etched using HCl and the plurality of second crystalline layers may be etched using ammonia. However it will be understood that the etchants are not limited to these examples and any acceptable etchant or combination of etchants may be used. By removing first crystalline layers 12 and second crystalline layers 14, it will be understood that thin dielectric 60 is exposed in cavity 52 and second spaces 54.

Figure 8:
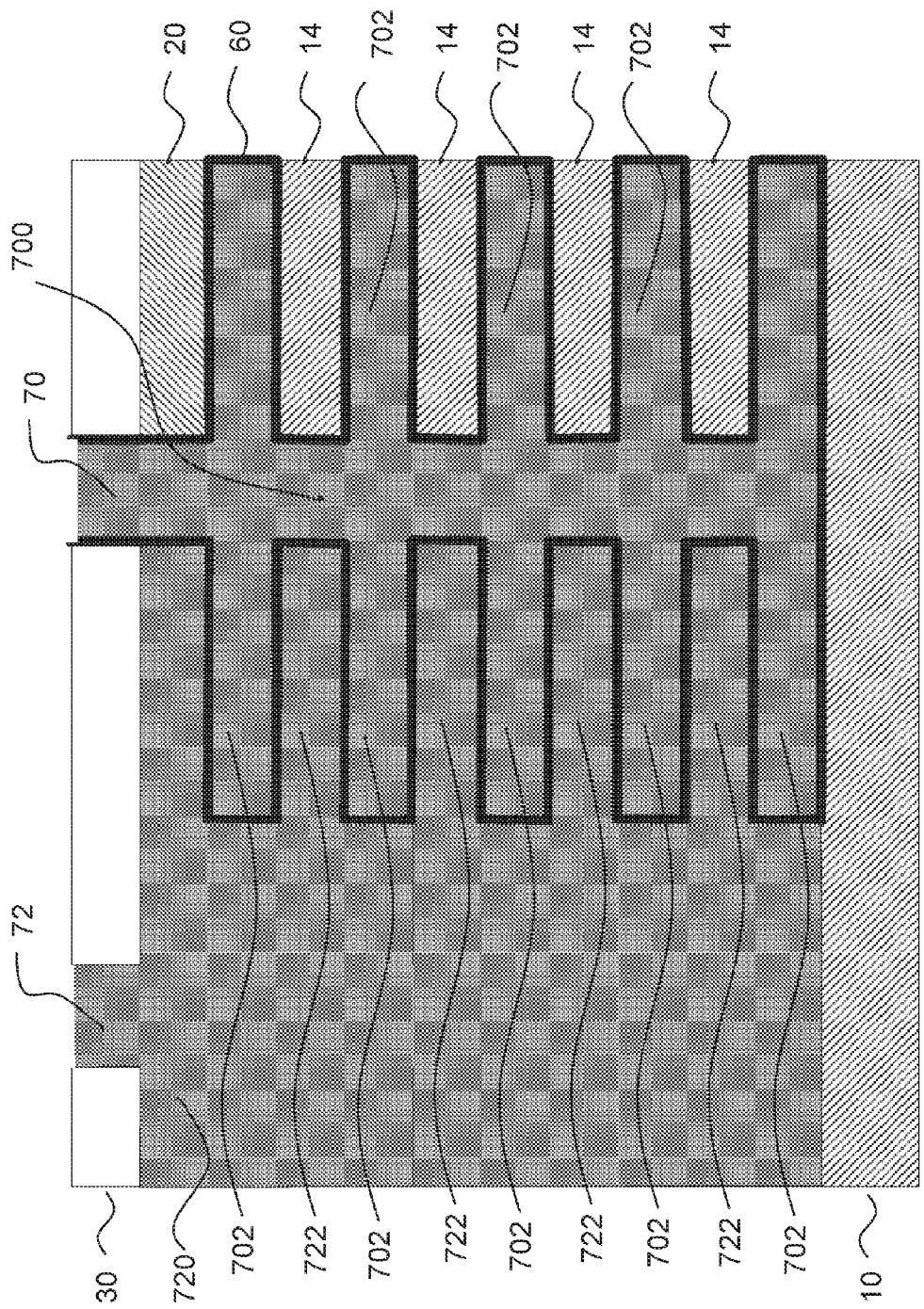
FIG. 8 depicts the structure FIG. 7 with further deposition of a metal in accordance with some embodiments of the disclosure.

As seen in FIG. 8, metal is deposited into cavity 52 by ALD to form a second capacitor terminal 72. Second capacitor terminal 72 includes second capacitor terminal central portion 720 formed in cavity 52 and second capacitor terminal lobes 722 formed in second spaces 54. Second capacitor terminal lobes 722 may be plate-shaped and extend laterally from second capacitor terminal central portion 720 of the second capacitor terminal 72. Second capacitor terminal lobes 722 may be mutually parallel. As further seen in FIG. 8, second capacitor terminal lobes 722 fit between consecutive first capacitor terminal lobes 702. In other words, first capacitor terminal lobes 702 and second capacitor terminal lobes 722 form a corrugated capacitor structure. The structure of first capacitor terminal 70, thin dielectric 60, and second capacitor 72 shown in FIG. 8 forms a trench metal-insulator-metal capacitor in accordance with some embodiments of the disclosure.

Figure 9:
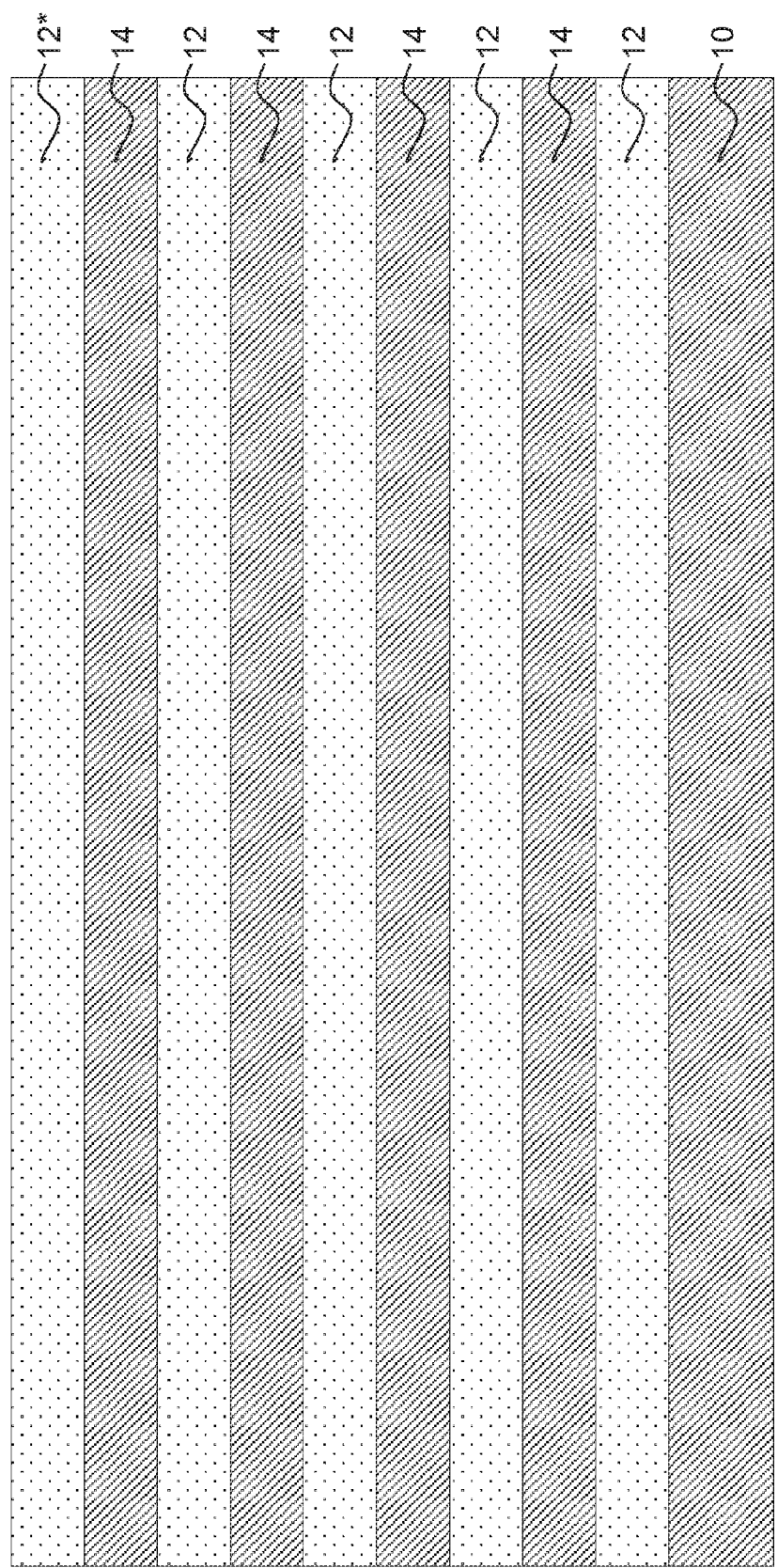
FIG. 9 depicts a cross-sectional view of a semiconductor structure in accordance with some embodiments of the disclosure.

FIGS. 9-18 show a method of forming a trench metal-insulator-metal capacitor in accordance with some embodiments of the disclosure in the context of CMOS fabrication. Similar to FIG. 1, FIG. 9 shows a substrate 10, first crystalline layers 12, and second crystalline layers 14. These structures are similar to those described above with reference to FIG. 1.

Figure 10:
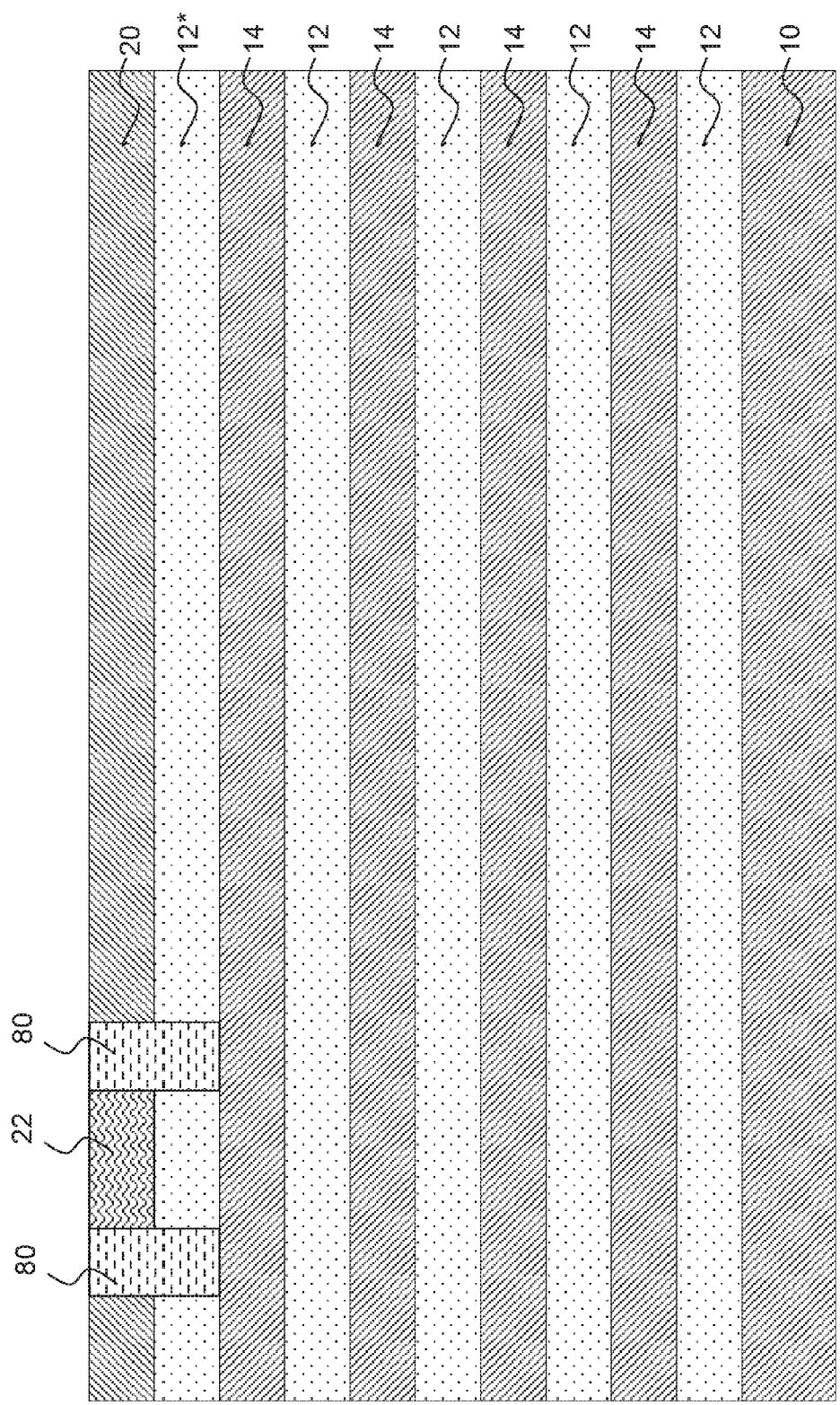
FIG. 10 depicts the structure of FIG. 9 with the addition of strained crystalline layers.

In FIG. 10, a strained Si layer 20, strained SiGe layer 22, and shallow trench isolation structures 80 are formed over the top-most first crystalline layer 12. Strained Si layer 20 may include tensile-strained Si, and strained SiGe layer 22 may include compressively strained SiGe. The Ge content of the strained SiGe layer 22 is approximately 20-30% higher than the Ge concentration of the underlying SiGe layers. For example, if the first crystalline layers 12 are SiGe layers having a Ge concentration of 25%, the strained SiGe layer 22 may have a Ge concentration of 45-55%. Shallow trench isolation structures 80 may be formed of a dielectric material such as $SiO_2$.

Figure 11:
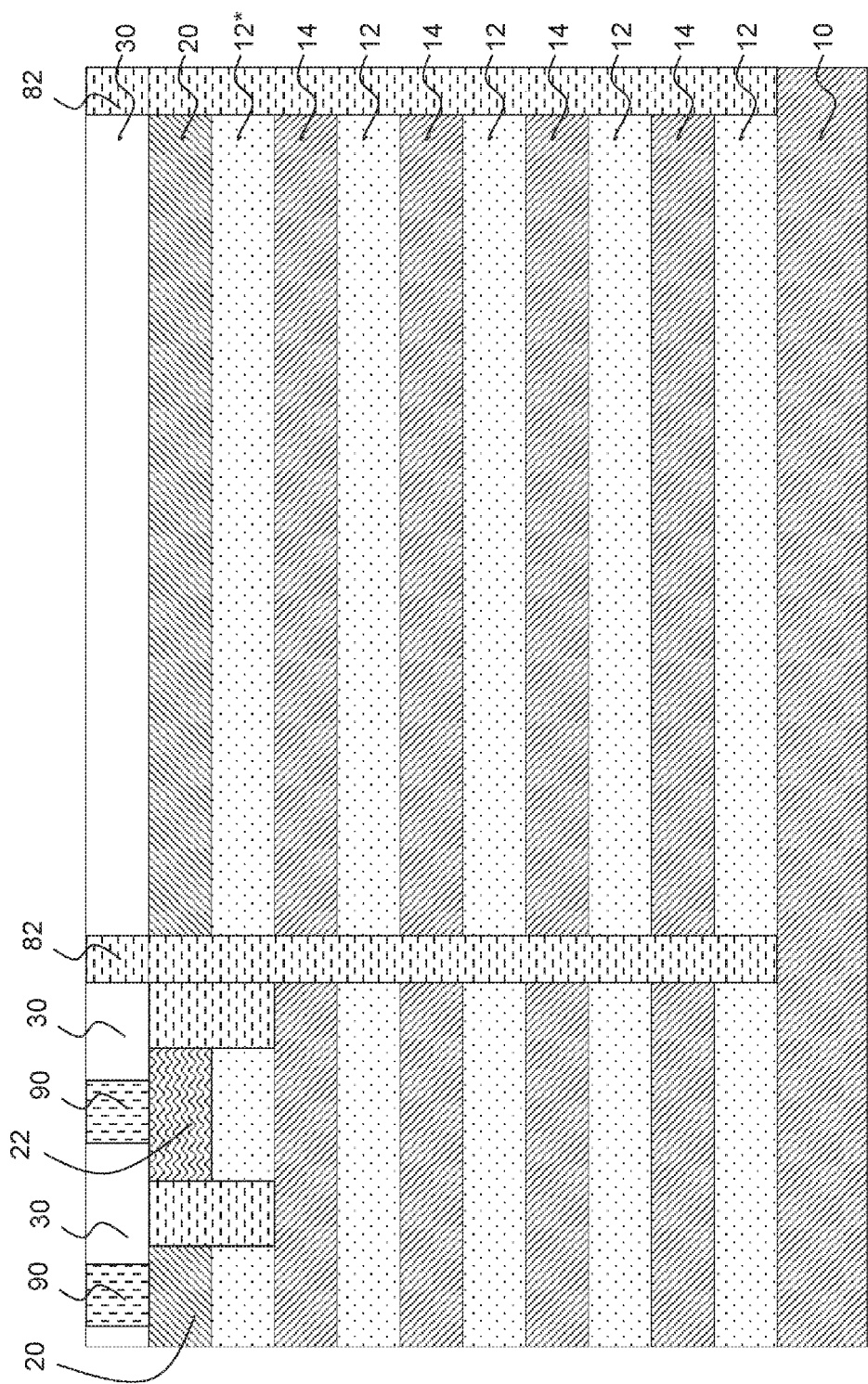
FIG. 11 depicts the structure of FIG. 10 with the addition of gate structures and an interlayer dielectric layer.

In FIG. 11, an interlayer dielectric 30 has been formed as a protective layer over strained Si layer 20, strained SiGe layer 22, and shallow trench isolation structures 80. A gate 90 may be formed over the strained Si layer 20 to form an nFET, and a gate 90 may be formed over the strained SiGe layer 22 to form a pFET. Additionally, deep trench isolation structures 82 may be formed to isolate a block for forming a decoupled capacitor.

Figure 12:
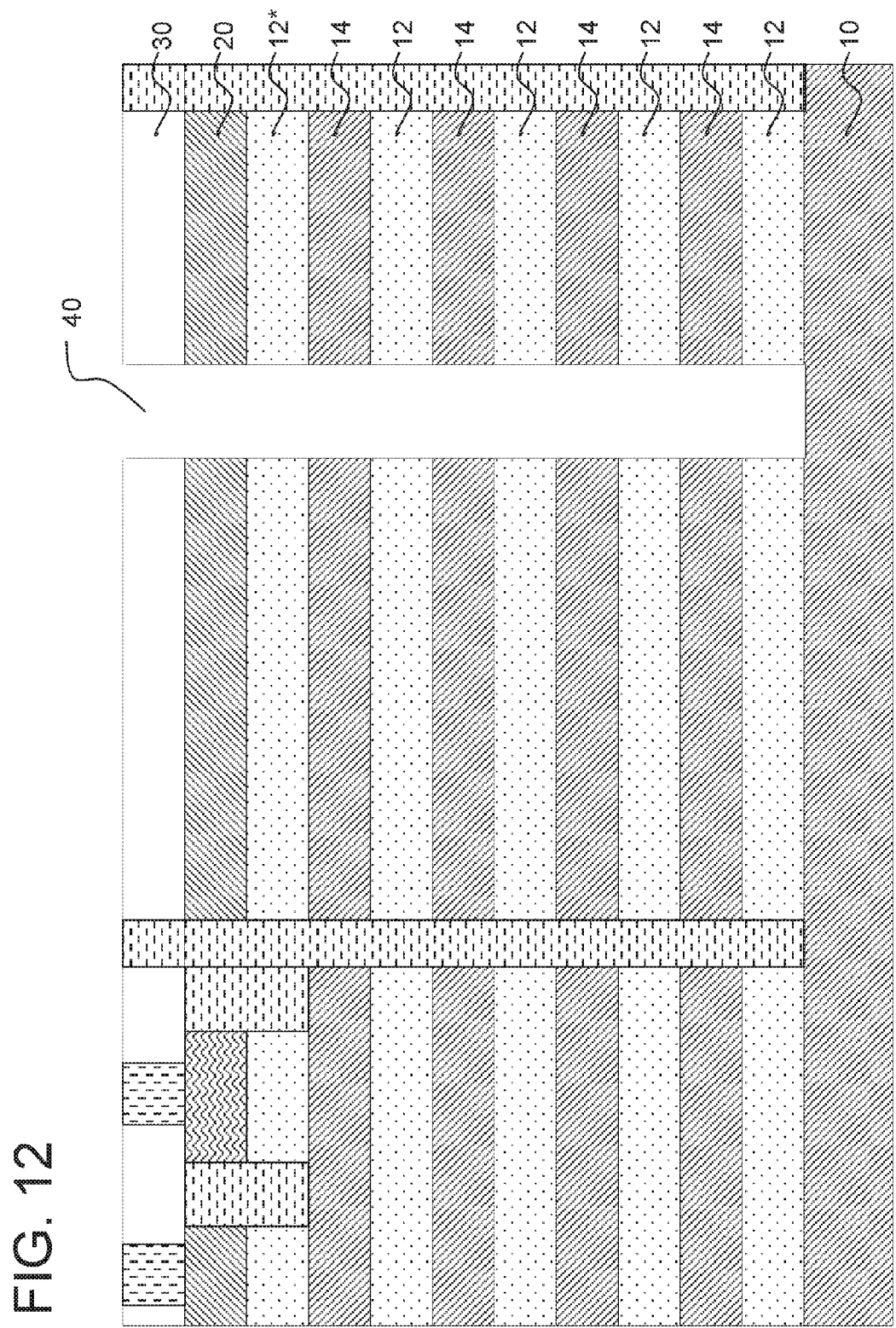
FIG. 12 depicts the structure of FIG. 11 with a trench in accordance with some embodiments of the disclosure.
Figure 13:
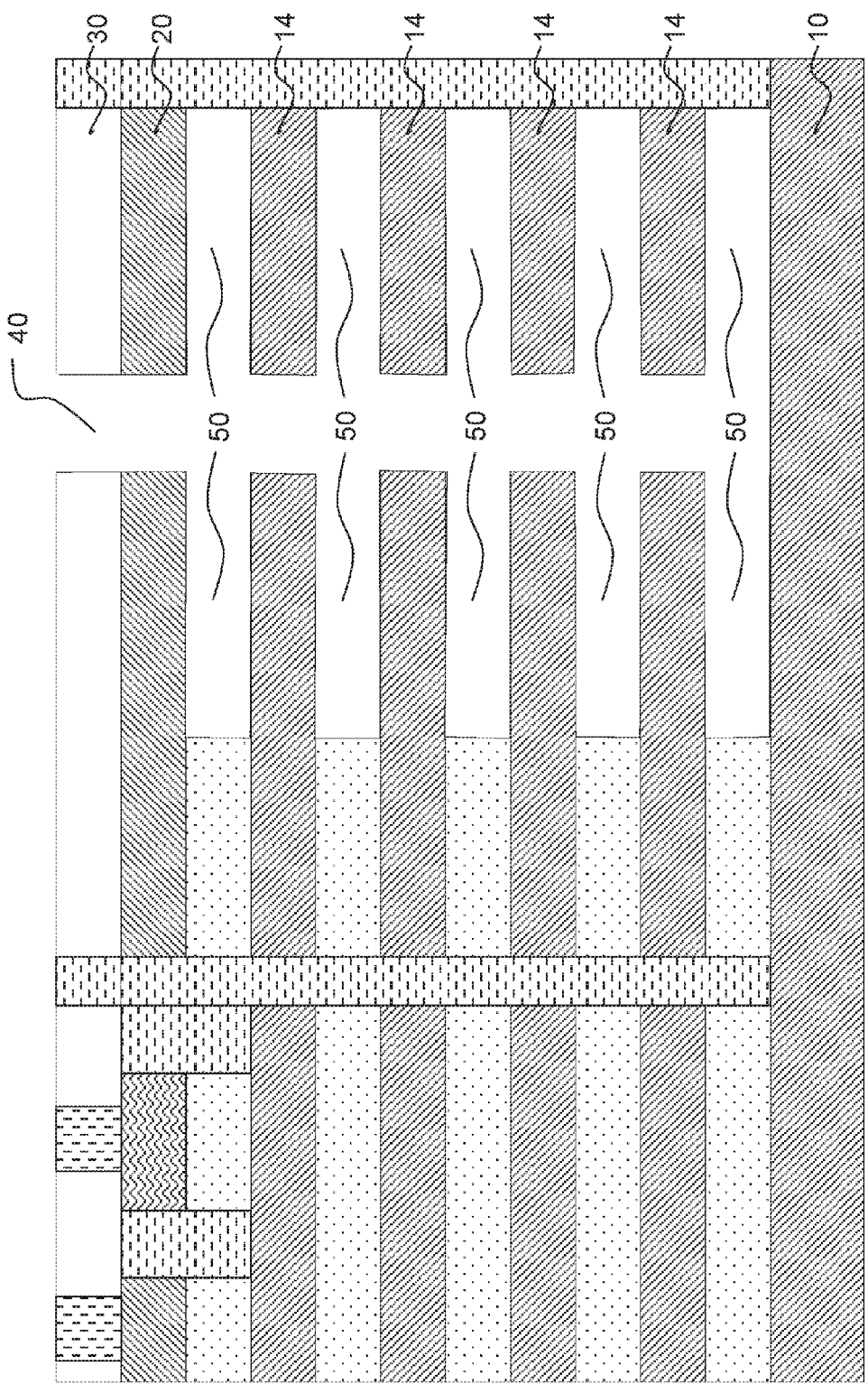
FIG. 13 depicts the structure of FIG. 12 with selective etching of layers in accordance with some embodiments of the disclosure.
Figure 14:
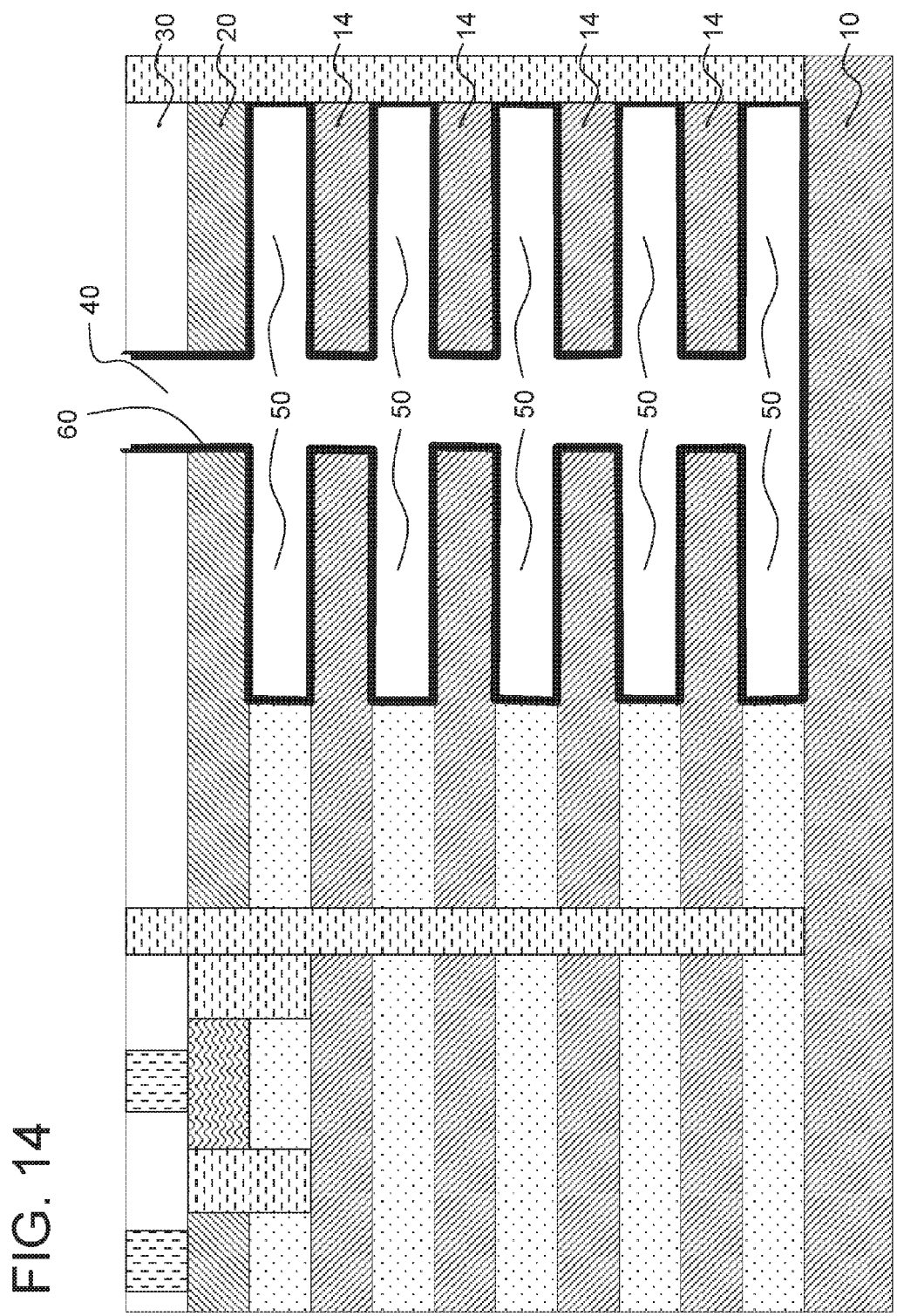
FIG. 14 depicts the structure of FIG. 13 with deposition of a dielectric in accordance with some embodiments of the disclosure.
Figure 15:
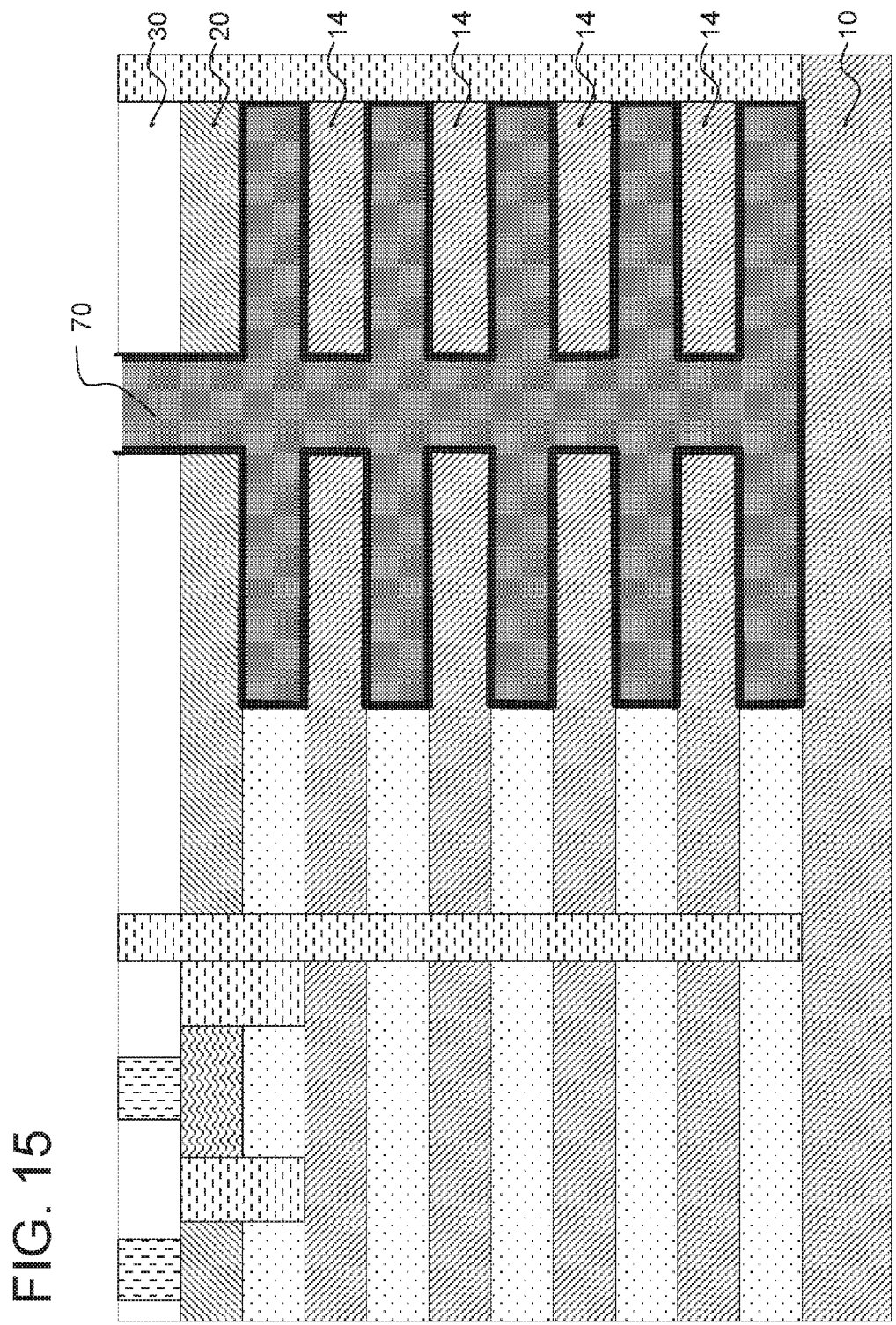
FIG. 15 depicts the structure of FIG. 14 with deposition of a metal in accordance with some embodiments of the disclosure.
Figure 16:
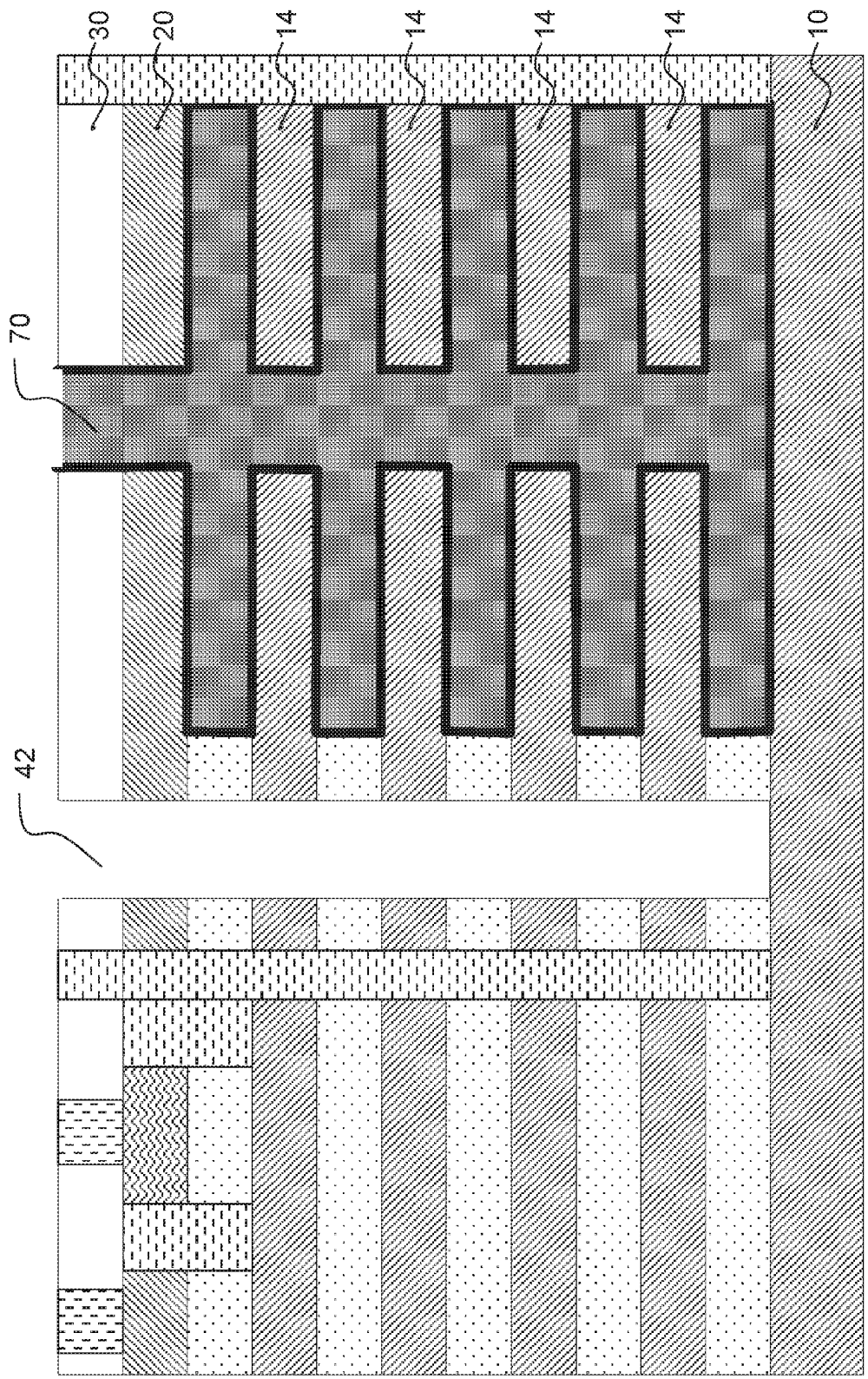
FIG. 16 depicts the structure of FIG. 15 with a second trench in accordance with some embodiments of the disclosure.
Figure 17:
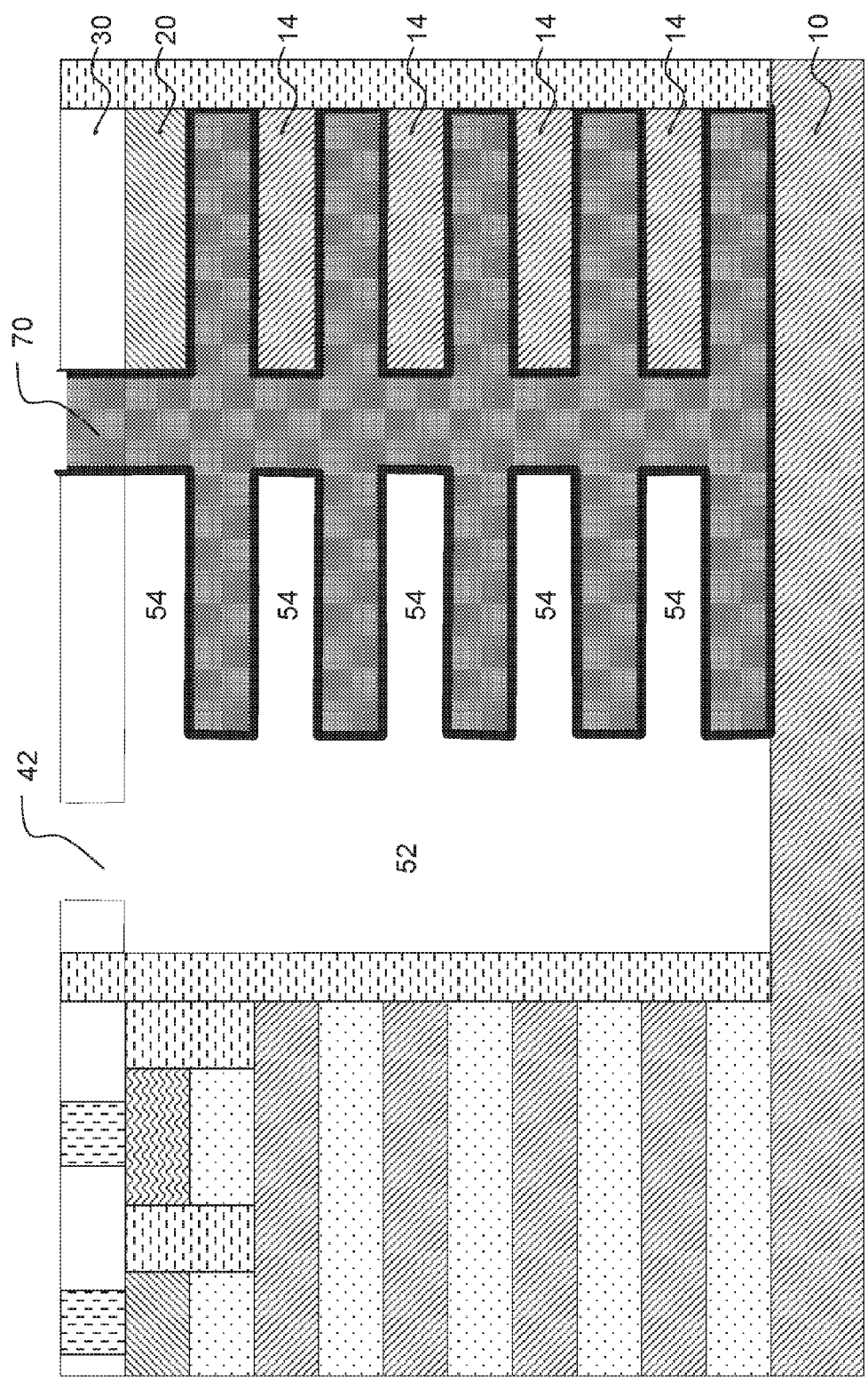
FIG. 17 depicts the structure of FIG. 16 with further etching of layers in accordance with some embodiments of the disclosure.
Figure 18:
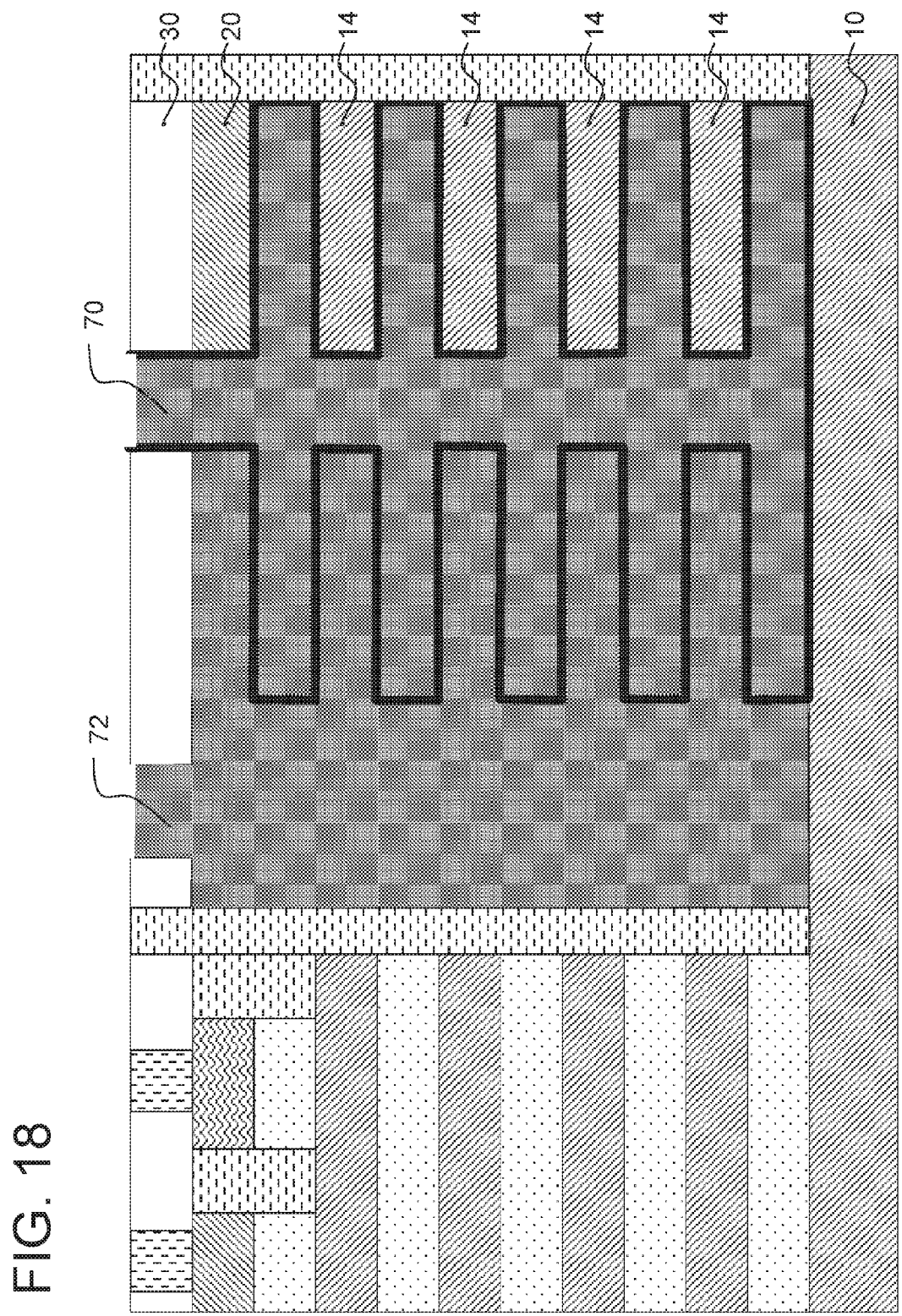
FIG. 18 depicts the structure FIG. 17 with further deposition of a metal in accordance with some embodiments of the disclosure.

FIGS. 12-18 show a method of forming a trench metal-insulator-metal capacitor in accordance with some embodiments similar to that shown in FIGS. 2-8. For example, FIG. 12 shows formation of first trench 40 by etching or cutting. FIG. 13 shows formation of first spaces 50 by selective etching of first crystalline layers 12. FIG. 14 shows deposition of thin dielectric 60 by ALD. FIG. 15 shows deposition of metal by ALD to form first capacitor terminal 70. FIG. 16 shows the formation of second trench 42 by etching or cutting. FIG. 17 shows further etching to form cavity 52 and second spaces 54. FIG. 18 shows deposition of metal by ALD to form second capacitor terminal 72.

In the embodiments described above, two capacitor terminals are formed from parallel trenches. However, it will be understood that, with appropriate space availability, more than two capacitor terminals may be formed in order to provide greater flexibility and scalability.

Figure 19:
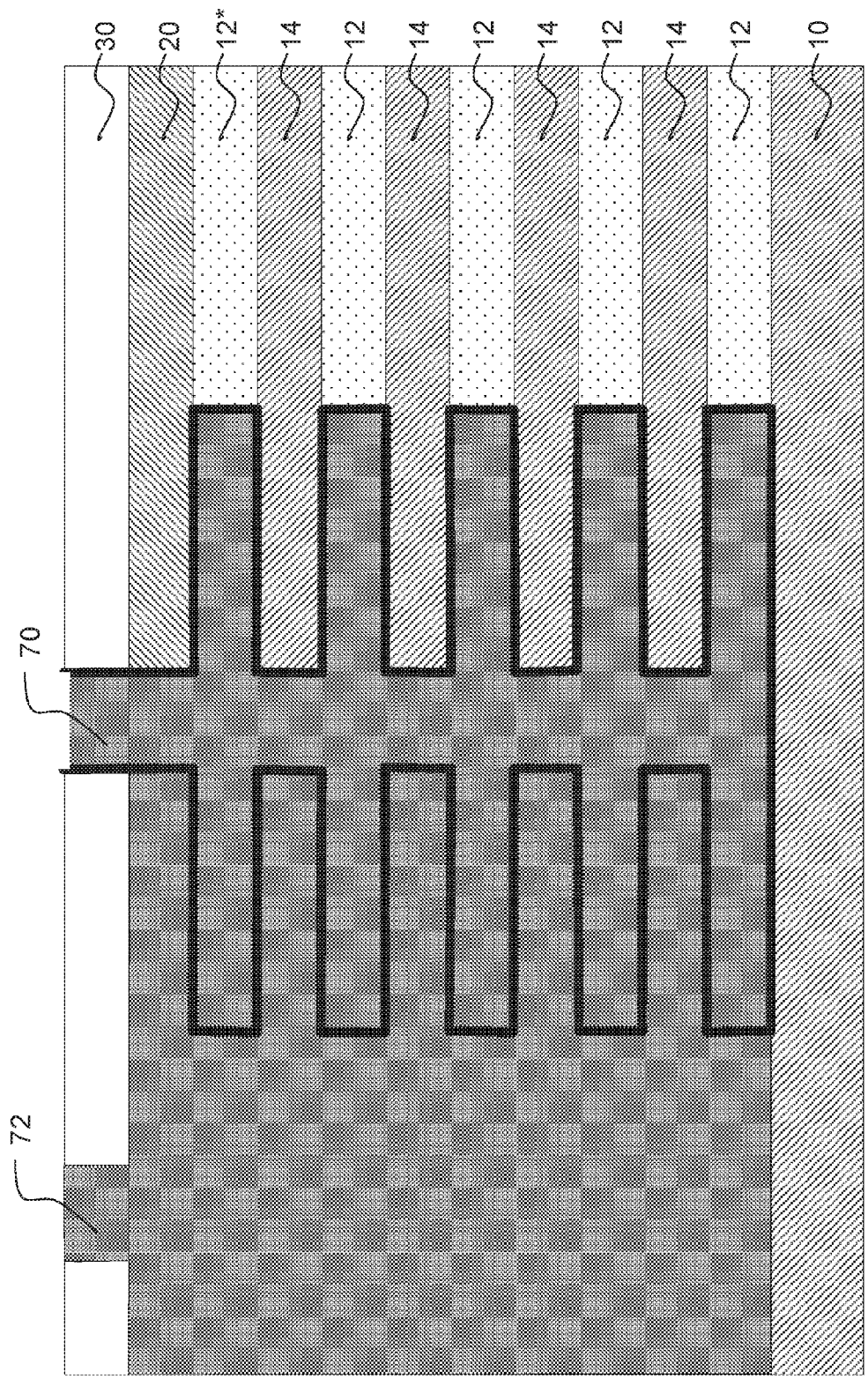
FIG. 19 depicts a cross-sectional view of a trench metal-insulator-metal capacitor in accordance with some embodiments of the disclosure.

For example, FIG. 19 shows an embodiment of a trench metal-insulator-metal capacitor having a first capacitor terminal 70 and second capacitor terminal 72. As further seen in FIG. 19, while second capacitor terminal 72 is formed to the left of first capacitor terminal, there remains additional room to the right of first capacitor terminal.

Figure 20:
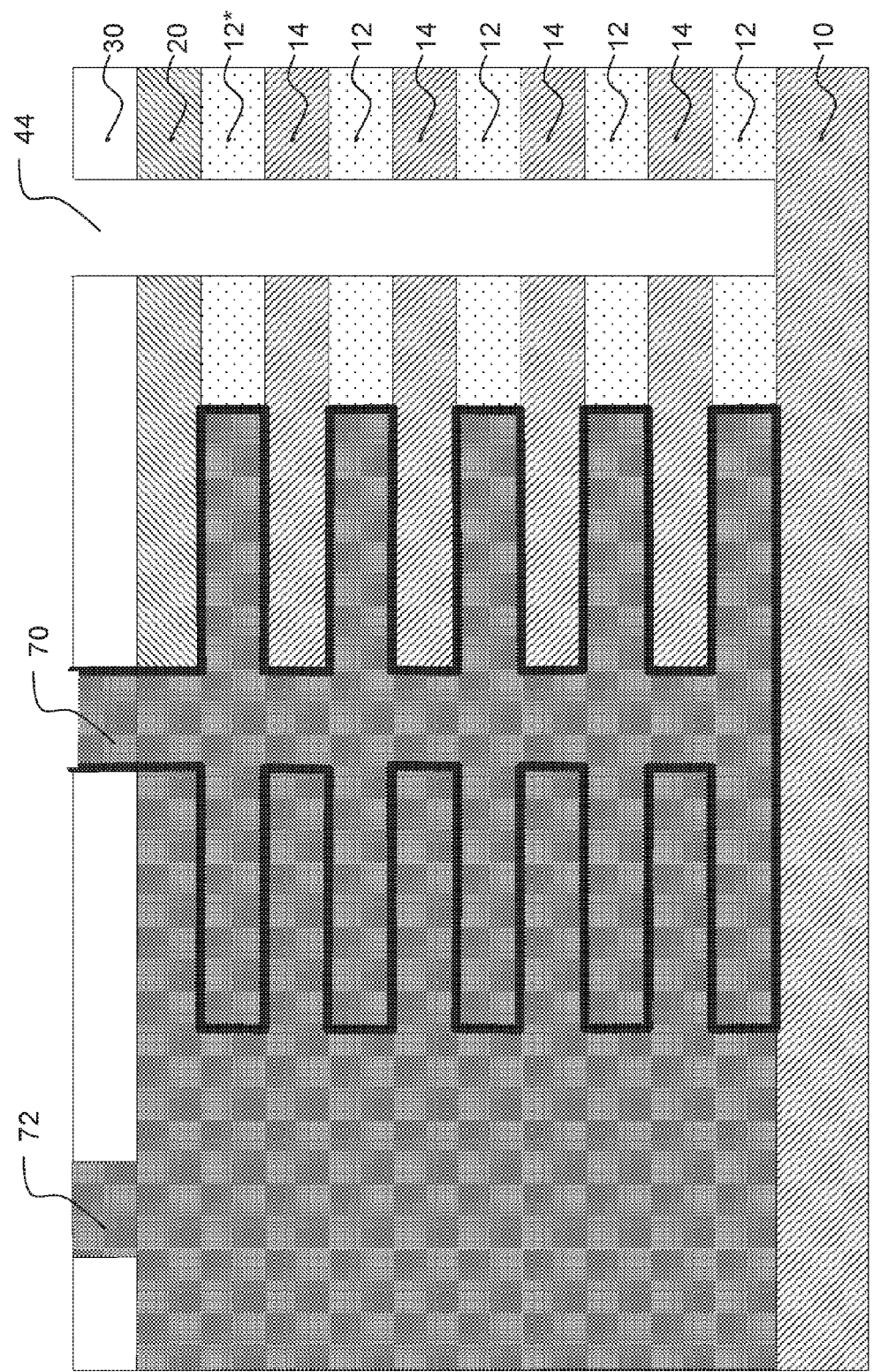
FIG. 20 depicts the structure of FIG. 19 with an additional trench in accordance with some embodiments of the disclosure.
Figure 21:
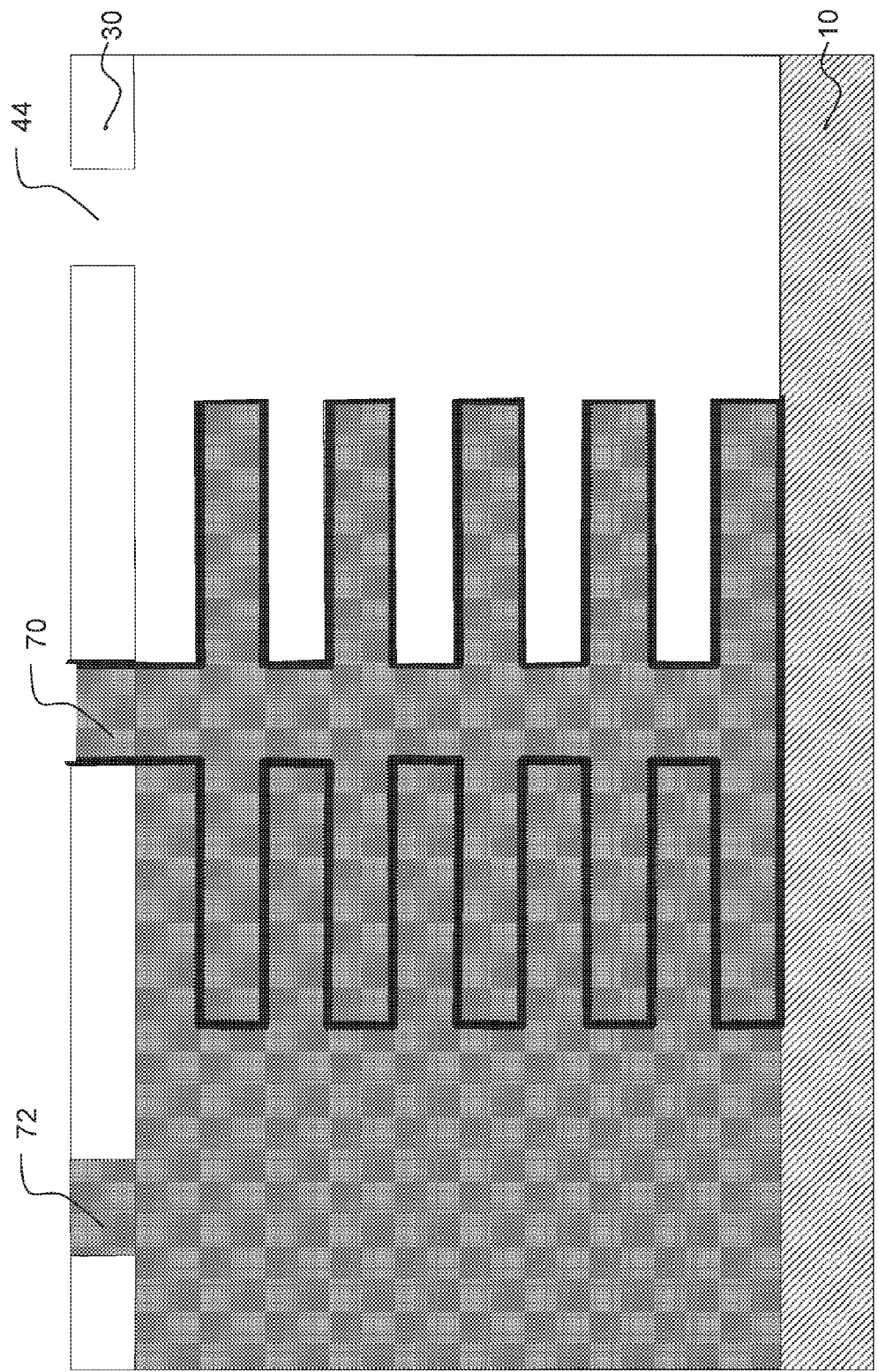
FIG. 21 depicts the structure of FIG. 20 with additional etching of layers in accordance with some embodiments of the disclosure.

FIG. 20 shows that a third trench 44 may be cut or etch into the semiconductor substrate. In FIG. 21, further etching is conducted to remove first crystalline layers 12 and second crystalline layers 14. FIG. 22 shows metal deposited by ALD to form third capacitor terminal 74. Similar to second capacitor terminal 72, third capacitor terminal 74 includes third capacitor terminal central portion 740 and third capacitor terminal lobes 742. Third capacitor terminal lobes 742 extend laterally from third capacitor terminal central portion 740 and may be mutually parallel. A portion of third capacitor terminal lobes 742 are fitted between consecutive first capacitor terminal lobes.

Figure 23:
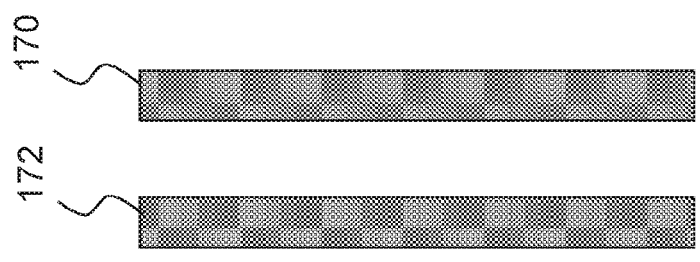
FIG. 23 depicts a top-down view of terminals of a trench metal-insulator-metal capacitor in accordance with some embodiments of the disclosure.

While FIGS. 1-22 have shown cross-sectional views, FIG. 23 shows a top-down view of first capacitor terminal 170 and second capacitor terminal 172. FIG. 23 shows only the top exposed surface of first capacitor terminal 170 and second capacitor, and it will be understood that the corrugated capacitor structure exists below the plane shown in FIG. 23. It will be understood that lengths of first capacitor terminal 170 and second capacitor terminal 172 may be extended as much as space permits to provide scalability. For example, it will be understood that longer lengths of first capacitor terminal 170 and second capacitor terminal 172 will increase the common surface area between the first capacitor terminal 170 and second capacitor terminal 172, thereby increasing capacitance. Alternatively, the lengths of first capacitor terminal 170 and second capacitor terminal 172 may be shortened to achieve a smaller capacitance.

Figure 24:
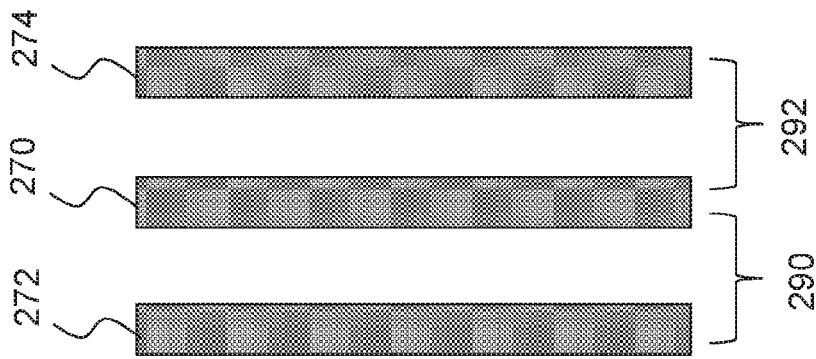
FIG. 24 depicts a top-down view of terminals of a trench metal-insulator-metal capacitor in accordance with some embodiments of the disclosure.

FIG. 24 shows a top-down view of a structure having first capacitor terminal 270, second capacitor terminal 272, and third capacitor terminal 274. This structure is analogous to the three-terminal structure shown in FIG. 22. In the structure shown in FIG. 24, the three parallel capacitor terminals 270, 272, 274 form a pair of capacitors in series. In other words, first capacitor terminal 270 and second capacitor terminal 272 form a first capacitor 290, and first capacitor terminal 270 and third capacitor terminal 274 form a second capacitor 292. Similar to the structure of FIG. 23, lengths of capacitor terminals 270, 272, 274 can be varied to vary the capacitance of first capacitor 290 and second capacitor 292.

Figure 25:
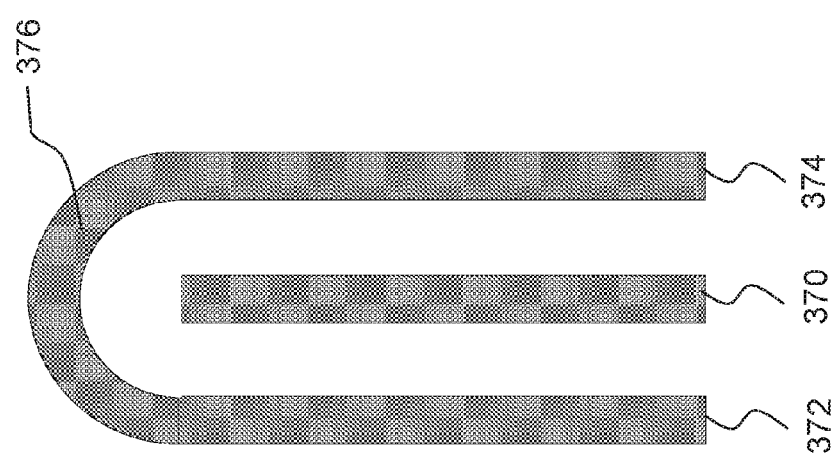
FIG. 25 depicts a top-down view of terminals of a trench metal-insulator-metal capacitor in accordance with some embodiments of the disclosure.

FIG. 25 shows a top-down view of a structure having first capacitor terminal 370, second capacitor terminal 372, and third capacitor terminal 374. In contrast with FIG. 24, in which capacitor terminals 270, 272, and 274 are separate to form two capacitors in series, a connector 376 is provided between second capacitor terminal 372 and third capacitor terminal 374. Referring to FIG. 5, in which the first crystalline layer 12 is selectively etched, it will be understood that, when a gas etchant is used, etching will proceed equidistantly from first trench 40. Thus, it will be understood that, at ends of trench 40, spaces 50 will be shaped in a semi-circular flat plate shape when viewed from above. Similarly, when metal is deposited in the trench to form a capacitor terminal such as first capacitor terminal 370, it will be understood that the lobes of first capacitor terminal will be formed in a semi-circular flat plate shape at ends of first capacitor terminal 370. Accordingly, connector 376 is formed in a circular arcuate shape to maximize the surface area formed between first capacitor terminal 370 and second capacitor terminal 372/third capacitor terminal 374. By connecting second capacitor terminal 372 and third capacitor terminal 374 in this way, the common surface area between first capacitor terminal 370 and combined capacitor terminal 372, 374 is increased so that the capacitance is greater than a capacitance between only first capacitor terminal 370 and second capacitor terminal 372.

Figure 26:
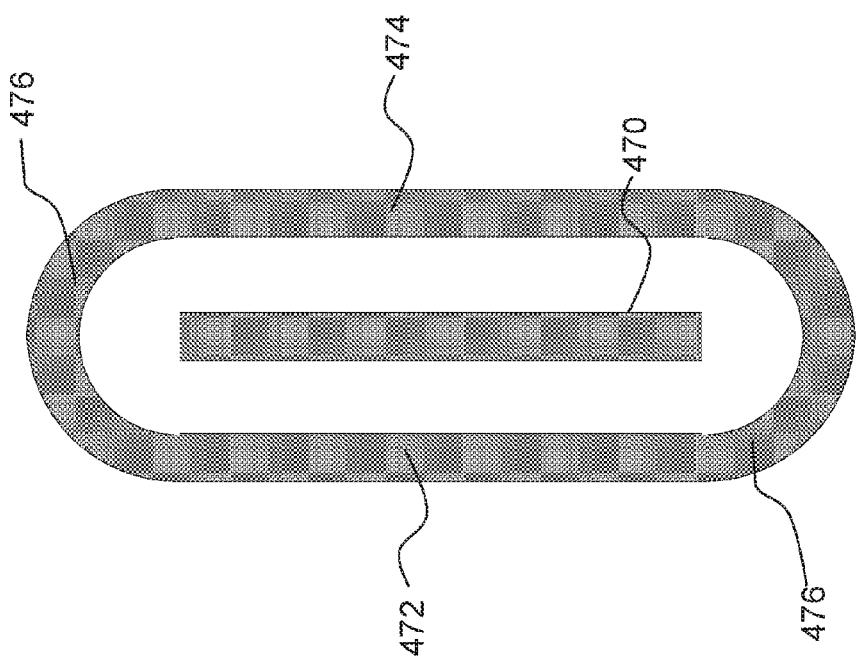
FIG. 26 depicts a top-down view of terminals of a trench metal-insulator-metal capacitor in accordance with some embodiments of the disclosure.

FIG. 26 shows a top-down view of a structure having first capacitor terminal 470, second capacitor terminal 472, and third capacitor terminal 474. Second capacitor terminal 472 and third capacitor terminal 474 are connected by a pair of connectors 476 in order to take advantage of the surface area at both ends of first capacitor terminal 470.

Figure 27:
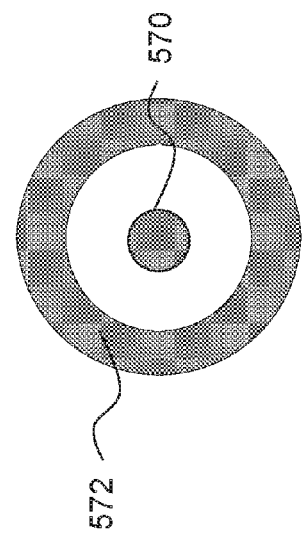
FIG. 27 depicts a top-down view of terminals of a trench metal-insulator-metal capacitor in accordance with some embodiments of the disclosure.

FIG. 27 shows a top-down view of a structure having first capacitor terminal 570, and second capacitor terminal 472. In FIG. 27, first capacitor terminal is formed as a hole instead of a trench, and second capacitor terminal 572 is formed in a circular shape surrounding first capacitor terminal 570. In other words, the structure of FIG. 27 is similar to the structure of FIG. 26, except that the lengths of the capacitor terminals are shortened significantly. The structure of FIG. 27 allows for the maximization of capacitance when space is very limited.

Figure 28:
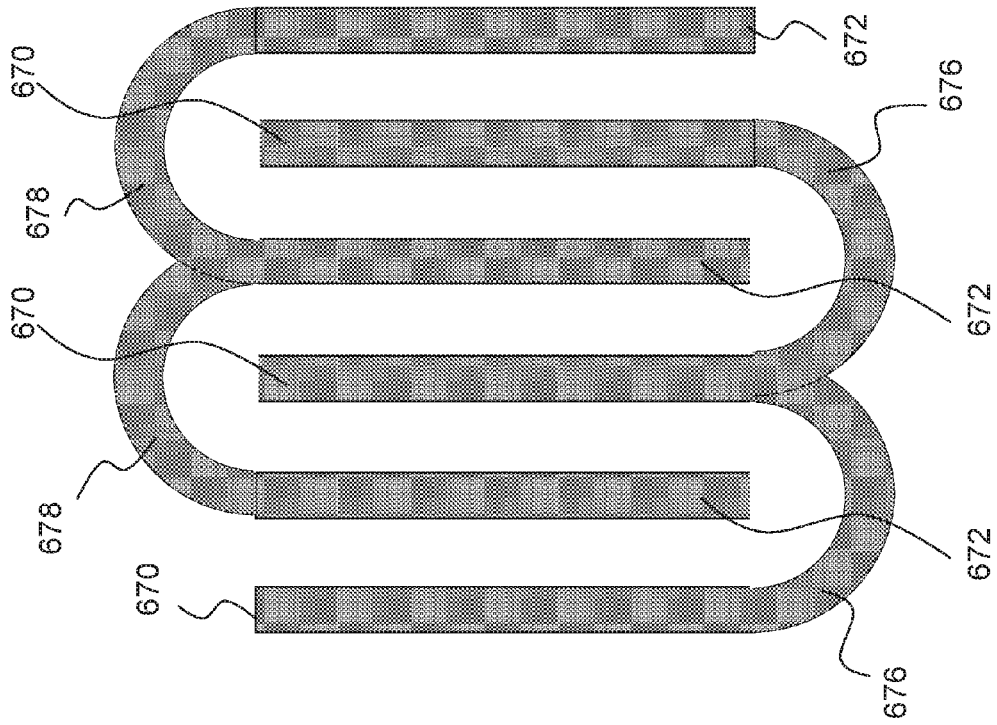
FIG. 28 depicts a top-down view of terminals of a trench metal-insulator-metal capacitor in accordance with some embodiments of the disclosure.

It will be understood that the structures described above are fully scalable and expandable to the limits of available space. For example, FIG. 28 shows a top-down view of a structure having first capacitor terminals 670 and second capacitor terminals 672. First capacitor terminals are electrically connected by connectors 676, and second capacitor terminals are electrically connected by connectors 678. First capacitor terminals 670 may be arranged mutually parallel and extending in a longitudinal direction. Second capacitor terminals 672 may be arranged mutually parallel and provided between consecutive first capacitor terminals 670. To form this structure, first capacitor terminals 670 and connectors 676 may be formed by etching or cutting trenches, selectively etching away the first crystalline layers, depositing thin dielectric by ALD, and depositing metal by ALD. Then second capacitor terminals 672 and connectors 678 may be formed by etching or cutting trenches, further etching the first and second crystalline layers, and depositing metal by ALD. While FIG. 28 shows three first capacitor terminals and three second capacitor terminals, it will be understood that the structure may be expanded to include more terminal structures, limited only by the available space.

What is claimed is:

1. A semiconductor fabrication method comprising:
    epitaxially growing a strain relaxed buffer on a substrate, the strain relaxed buffer comprising a plurality of first crystalline layers and a plurality of second crystalline layers arranged alternately;
    epitaxially growing a strained crystalline layer on the strain relaxed buffer;
    forming a protective layer over the strained crystalline layer;
    forming a first trench through the protective layer, the strained crystalline layer, and the strain relaxed buffer;
    selectively etching the plurality of first crystalline layers from with the first trench to create a plurality of first spaces extending laterally from the first trench;
    depositing a dielectric along surfaces of the first trench and the plurality of first spaces using atomic layer deposition;
    filling the first trench and the plurality of first spaces with a metal using atomic layer deposition;
    forming a second trench through the protective layer, the strained crystalline layer, and the strain relaxed buffer;
    etching the plurality of first crystalline layers and the plurality of second crystalline layers from within the second trench to expose the dielectric and form a cavity and a plurality of second spaces extending laterally from the first trench; and
    filling the cavity and the plurality of second spaces with the metal using atomic layer deposition.

2. The method of claim 1, wherein the plurality of first crystalline layers comprises a plurality of SiGe layers, wherein the Ge concentration of the plurality of SiGe layers is approximately 25%.

3. The method of claim 2, wherein the selectively etching the plurality of first crystalline layers comprises etching using an HCl gas.

4. The method of claim 1, wherein the plurality of second crystalline layers comprises a plurality of Si layers.

5. The method of claim 4, wherein the etching the plurality of first crystalline layers and the plurality of second crystalline layers from within the second trench comprises etching with HCl and etching with ammonia.

6. The method of claim 1, wherein the dielectric comprises a $SiO_2$ layer having a thickness in a range of 2-10 nm.

7. The method of claim 1, wherein the strain relaxed buffer has a thickness in a range of 1-5 μm.

8. The method of claim 1, wherein each of the plurality of first crystalline layers and each of the plurality of second crystalline layers has a thickness in a range of 10-50 nm.

9. A semiconductor structure comprising:
    a strain relaxed buffer comprising a plurality of first crystalline layers and a plurality of second crystalline layers, wherein the first crystalline layers and second crystalline layers are arranged alternately; and a capacitor provided inside the strain relaxed buffer; the capacitor comprising:
a first capacitor terminal;
a second capacitor terminal; and
a dielectric provided between the first capacitor terminal and the second capacitor terminal;
wherein the first capacitor terminal comprises:
a first capacitor terminal central portion extending through the first crystalline layers and the second crystalline layers; and
a plurality of first capacitor terminal lobes extending laterally from the first capacitor terminal central portion;
the second capacitor terminal comprises:
a second capacitor terminal central portion extending through the first crystalline layers and the second crystalline layers; and
a plurality of second capacitor terminal lobes extending laterally from the second capacitor terminal central portion;
the first capacitor terminal and the second capacitor terminal are arranged such that a portion of the plurality of second capacitor terminal lobes are fitted between consecutive first capacitor terminal lobes; and
the first capacitor terminal and the second capacitor terminal comprise a metal.

10. The semiconductor structure of claim 9, wherein the plurality of first crystalline layers comprises a plurality of SiGe layers, wherein the Ge concentration of the plurality of SiGe layers is approximately 25%.

11. The semiconductor structure of claim 9, wherein the plurality of second crystalline layers comprises a plurality of Si layers.

12. The semiconductor structure of claim 9, wherein the dielectric comprises a $SiO_2$ layer having a thickness in a range of 2-10 nm.

13. The semiconductor structure of claim 9, further comprising:
a third capacitor terminal formed on a side of the first capacitor terminal opposite to second capacitor terminal;
wherein the third capacitor comprises:
a third capacitor terminal central portion extending through the first crystalline layers and the second crystalline layers; and
a plurality of third capacitor terminal lobes extending laterally from the third capacitor terminal central portion;
wherein the first capacitor terminal and the third capacitor terminal are arranged such that a portion of the plurality of third capacitor terminal lobes are fitted between consecutive first capacitor terminal lobes.

14. The semiconductor structure of claim 13, wherein the second semiconductor terminal and the third semiconductor terminal are electrically connected.

15. The semiconductor structure of claim 9, wherein the stress relaxed buffer has a thickness in a range of 1-5 μm.

16. The semiconductor structure of claim 9, wherein each of the plurality of first crystalline layers and each of the plurality of second crystalline layers has a thickness in a range of 10-50 nm.

17. A semiconductor structure comprising:
a strain relaxed buffer comprising a plurality of first crystalline layers and a plurality of second crystalline layers, wherein the first crystalline layers and second crystalline layers are arranged alternately; and
a capacitor provided inside the strain relaxed buffer; the capacitor comprising:
a plurality of first capacitor terminals;
a plurality of second capacitor terminals; and
a dielectric provided between the plurality of first capacitor terminals and the plurality of second capacitor terminals;
wherein each of the plurality of first capacitor terminals comprises:
a first capacitor terminal central portion extending through the first crystalline layers and the second crystalline layers; and
a plurality of first capacitor terminal lobes extending laterally from the first capacitor terminal central portion;
each of the plurality of second capacitor terminal comprises:
a second capacitor terminal central portion extending through the first crystalline layers and the second crystalline layers; and
a plurality of second capacitor terminal lobes extending laterally from the second capacitor terminal central portion;
each of the plurality of first capacitor terminals are mutually electrically connected;
each of the plurality of second capacitor terminals are mutually electrically connected;
wherein each first capacitor terminal central portion of the plurality of first capacitor terminals are mutually parallel and extend in a longitudinal direction;
wherein each second terminal capacitor central portion of the plurality of second capacitor terminals are mutually parallel; and
a portion of the plurality of second capacitor terminals are provided between consecutive first capacitor terminals and arranged such that a portion of the plurality of second capacitor terminal lobes are fitted between consecutive first capacitor terminal lobes.

* * * * *